United States Patent
Oh et al.

(10) Patent No.: US 8,237,149 B2
(45) Date of Patent: Aug. 7, 2012

(54) NON-VOLATILE MEMORY DEVICE HAVING BOTTOM ELECTRODE

(75) Inventors: Gyu-Hwan Oh, Hwasung (KR);
Sug-Woo Jung, Hwasung (KR);
Dong-Hyun Im, Hwasung (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 13/087,189

(22) Filed: Apr. 14, 2011

(65) Prior Publication Data

US 2011/0193048 A1 Aug. 11, 2011

Related U.S. Application Data

(60) Continuation-in-part of application No. 12/796,084, filed on Jun. 8, 2010, now Pat. No. 8,138,490, which is a division of application No. 11/848,379, filed on Aug. 31, 2007, now Pat. No. 7,759,159.

(30) Foreign Application Priority Data

Jun. 18, 2007 (KR) .................. 10-2007-0059273
Nov. 22, 2010 (KR) .................. 10-2010-0116251

(51) Int. Cl.
*H01L 47/00* (2006.01)
*H01L 27/108* (2006.01)
*H01L 29/94* (2006.01)
*H01L 31/032* (2006.01)

(52) U.S. Cl. .......... 257/4; 257/3; 257/296; 257/E31.029
(58) Field of Classification Search ............. 257/3, 4, 257/296, E31.029
See application file for complete search history.

(56) References Cited

U.S. PATENT DOCUMENTS

| | | | |
|---|---|---|---|
| 6,586,761 B2 | 7/2003 | Lowrey | |
| 6,649,928 B2 | 11/2003 | Dennison | |
| 6,903,361 B2 * | 6/2005 | Gilton | ............................. 257/2 |
| 6,969,866 B1 | 11/2005 | Lowrey et al. | |
| 7,329,579 B2 | 2/2008 | Ha et al. | |
| 7,332,401 B2 | 2/2008 | Moore et al. | |
| 7,884,343 B2 | 2/2011 | Lung et al. | |
| 7,993,957 B2 | 8/2011 | Bez et al. | |
| 2006/0043355 A1 | 3/2006 | Ryoo et al. | |
| 2006/0072370 A1 | 4/2006 | Kuh et al. | |

(Continued)

FOREIGN PATENT DOCUMENTS

JP        2002-540605 A        11/2002

(Continued)

OTHER PUBLICATIONS

Office Action, Korean Application No. 10-2007-0059273, Mar. 25, 2008.

*Primary Examiner* — Luan C Thai
(74) *Attorney, Agent, or Firm* — Myers Bigel Sibley & Sajovec, P.A.

(57) ABSTRACT

Provided is a non-volatile memory device including a bottom electrode disposed on a substrate and having a lower part and an upper part. A conductive spacer is disposed on a sidewall of the lower part of the bottom electrode. A nitride spacer is disposed on a top surface of the conductive spacer and a sidewall of the upper part of the bottom electrode. A resistance changeable element is disposed on the upper part of the bottom electrode and the nitride spacer. The upper part of the bottom electrode contains nitrogen (N).

20 Claims, 26 Drawing Sheets

U.S. PATENT DOCUMENTS

| | | |
|---|---|---|
| 2006/0284237 A1 | 12/2006 | Park et al. |
| 2007/0117315 A1 | 5/2007 | Lai et al. |
| 2008/0042118 A1 | 2/2008 | Hayakawa |
| 2008/0280390 A1 | 11/2008 | Kim et al. |
| 2008/0315174 A1 | 12/2008 | Kang et al. |
| 2010/0096613 A1* | 4/2010 | Morikawa et al. ............ 257/4 |

FOREIGN PATENT DOCUMENTS

| | | |
|---|---|---|
| JP | 2007-5785 A | 1/2007 |
| JP | 2008-283179 A | 11/2008 |
| JP | 2009-4785 A | 1/2009 |
| KR | 10-0441692 B1 | 7/2004 |
| KR | 10-2006-0133394 A | 12/2006 |
| KR | 10-0655796 B1 | 12/2006 |
| KR | 10-2007-0031714 A | 3/2007 |
| KR | 10-2009-0002548 A | 1/2009 |
| KR | 10-0881055 B1 | 1/2009 |
| KR | 10-0883412 B1 | 2/2009 |

* cited by examiner

NON-VOLATILE MEMORY DEVICE HAVING BOTTOM ELECTRODE

CROSS-REFERENCE TO RELATED APPLICATION

This application claims priority under 35 U.S.C. §119 to Korean Patent Application No. 10-2010-0116251 filed on Nov. 22, 2010, the disclosure of which is hereby incorporated by reference in its entirety. The present application is also a continuation-in-part (C.I.P.) application of U.S. patent application Ser. No. 12/796,084, filed Jun. 8, 2010, that is entitled "Variable Resistance Non-volatile Memory Cells and Methods of Fabricating Same", which itself is a divisional of and claims priority to U.S. patent application Ser. No. 11/848,379, filed Aug. 31, 2007, which itself claims priority under 35 U.S.C. §119 to Korean Application No. 10-2007-0059273, filed on Jun. 18, 2007, which are fully incorporated herein by reference in their entirety.

BACKGROUND

1. Field

Embodiments of the inventive concept relate to a semiconductor device having a resistance changeable element and a bottom electrode.

2. Description of Related Art

Non-volatile memory devices are widely used in many consumer, commercial and other applications. While some non-volatile memory devices, such as flash memory, use accumulated charge to store data, some other memory devices, such as resistive random access memory (RRAM), phase change RAM (PRAM), and magnetic RAM (MRAM), use change in resistivity of a material therein to store data.

A resistive memory cell generally includes a bottom electrode, a top electrode, and a variable resistivity material connected therebetween. The resistive memory cell can be configured so that the resistivity of the material is controlled in response to a voltage that is applied between the first and second electrodes.

A PRAM device may include a phase changeable material layer which functions as a variable resistivity material. In response to sufficient heat, the phase changeable material layer may change phase so that its resistance changes and remains changed after its temperature returns to a pre-heating level. The phase changeable material layer may be formed from a chalcogenide material that includes germanium (Ge), antimony (Sb), and/or tellurium (Te). The phase of the material can be controlled in response to a level of current and/or duration of current that is applied to an electrode to heat the material a sufficient amount to change its phase. The resistance of the phase changeable material layer varies in response with its phase. For example, when the phase changeable material has a crystalline state, its resistance can be substantially less than when the phase changeable material layer has an amorphous state. Accordingly, the resistance of the phase changeable material in a PRAM device is controlled to store a logic value and is sensed to read the logic value.

To downscale non-volatile memory devices and improve their performance, research has been conducted on various methods for reducing the size of a bottom electrode. When forming a PRAM cell, it can be desirable to reduce the size of the bottom electrode and, thereby, a contact area between the bottom electrode and the phase-change material. However, reducing the size of the bottom electrode can degrade an electrical connection between the bottom electrode and associated diode. For example, reducing the contact area between the bottom electrode and the diode causes can degrade current drivability.

It is therefore desirable to develop a processes for fabricating a non-volatile memory device capable having improved current drivability of a bottom electrode, while minimizing a contact area between the bottom electrode and the phase-change material.

SUMMARY

Some embodiments of the inventive concept provide a non-volatile memory device that may be capable of improving the current drivability of a bottom electrode.

Other embodiments of the inventive concept provide a method of fabricating a non-volatile memory device that may have improved current drivability of a bottom electrode.

Still other embodiments of the inventive concept provide an electronic system with a non-volatile memory device that may have improved current drivability of a bottom electrode.

The technical objectives of the inventive disclosure are not limited to the above disclosure; other objectives may become apparent to those of ordinary skill in the art based on the following descriptions.

In accordance with an aspect of the inventive concept, a non-volatile memory device includes a bottom electrode disposed on a substrate and having a lower part and an upper part. A conductive spacer is disposed on a sidewall of the lower part of the bottom electrode. A nitride spacer is disposed on a top surface of the conductive spacer and a sidewall of the upper part of the bottom electrode. A resistance changeable element is disposed on the upper part of the bottom electrode and the nitride spacer. The upper part of the bottom electrode contains nitrogen (N).

In some embodiments, the conductive spacer is directly on the sidewall of the lower part of the bottom electrode, and the nitride spacer is directly on the sidewall of the upper part of the bottom electrode.

In another embodiment, the nitride spacer may include a material obtained by nitrifying the conductive spacer. The nitride spacer may be self-aligned with the conductive spacer. The conductive spacer includes silicon (Si), and the nitride spacer may include silicon nitride.

In another embodiment, a top surface of the upper part of the bottom electrode may be lower than a top surface of the nitride spacer. The resistance changeable element may be in contact with the top surface of the upper part of the bottom electrode and a lateral surface of the nitride spacer.

In still another embodiment, a top surface of the nitride spacer may be lower than a top surface of the upper part of the bottom electrode relative to the substrate.

In yet another embodiment, a metal silicide layer may be further interposed between the lower part of the bottom electrode and the conductive spacer. A metal silicide nitride layer may be disposed on the metal silicide layer. The metal silicide nitride layer may be interposed between the nitride spacer and the upper part of the bottom electrode.

In yet another embodiment, a core layer may be further disposed under the resistance changeable element. The bottom electrode may cover a sidewall and bottom surface of the core layer.

In yet another embodiment, a core nitride layer may be further disposed on and self-aligned with the core layer. The core nitride layer may cover the sidewall of the upper part of the bottom electrode.

In yet another embodiment, a lower insulating layer having a contact hole may be further disposed on the substrate. The bottom electrode, the conductive spacer, and the nitride spacer may be confined within the contact hole.

In yet another embodiment, a diode may be disposed on the substrate. The bottom electrode and the conductive spacer may be disposed on the diode.

In yet another embodiment, the diode may include a first diode pattern, and a second diode pattern disposed on the first diode pattern. The conductive spacer may be in contact with the second diode pattern, and the second diode pattern and the conductive spacer may include semiconductor layers of the same conductivity type.

In yet another embodiment, each of the second diode pattern and the conductive spacer may include a P-type silicon layer.

In yet another embodiment, the conductive spacer may extend between the bottom electrode and the second diode pattern.

In yet another embodiment, the upper and lower parts of the bottom electrode may include the same material.

In yet another embodiment, the lower part of the bottom electrode may contain a smaller amount of nitrogen than the upper part thereof.

In accordance with another aspect of the inventive concept, a non-volatile memory device includes a first diode pattern disposed on a substrate, a second diode pattern disposed on the first diode pattern, a bottom electrode disposed on the second diode pattern, a conductive spacer disposed on the second diode pattern and configured to cover a sidewall of the bottom electrode, a nitride spacer disposed on the conductive spacer and adjacent to the sidewall of the bottom electrode, a metal silicide layer interposed between the conductive spacer and the bottom electrode, a metal silicide nitride layer disposed on the metal silicide layer and interposed between the nitride spacer and the bottom electrode, and a resistance changeable element disposed on the bottom electrode, the metal silicide nitride layer and the nitride spacer. The metal silicide layer is in contact with the second diode pattern.

In some embodiments, the metal silicide layer may extend between the bottom electrode and the second diode pattern. A bottom surface of the metal silicide layer may be lower than a top surface of the second diode pattern.

In another embodiment, the conductive spacer may be in contact with the second diode pattern. The conductive spacer may include a semiconductor layer of the same conductivity type as the second diode pattern.

In accordance with still another aspect of the inventive concept, an electronic system includes a microprocessor (MP) and a non-volatile memory device disposed adjacent to and electrically connected to the MP. The non-volatile memory device includes a bottom electrode disposed on a substrate and having a lower part and an upper part. A conductive spacer is disposed on a sidewall of the lower part of the bottom electrode. A nitride spacer is disposed on a top surface of the conductive spacer and a sidewall of the upper part of the bottom electrode. Also, a resistance changeable element is disposed on the upper part of the bottom electrode and the nitride spacer. The upper part of the bottom electrode contains nitrogen (N).

In accordance with still another aspect of the invention concept, a non-volatile memory device includes a substrate, a diode pattern on the substrate, a bottom electrode, a conductive spacer, and a resistance changeable element. The bottom electrode is on the diode pattern and extends upward away from the substrate. An upper portion of the bottom electrode contains more nitrogen than a lower portion of the bottom electrode. The conductive spacer extends from the diode pattern upward covering a sidewall of the bottom electrode. The upper portion of the conductive spacer is a nitride spacer containing more nitrogen than a lower portion of the conductive spacer. The resistance changeable element is on the bottom electrode and the nitride spacer.

In another embodiment, the non-volatile memory device further includes a metal silicide layer that extends from the diode pattern upward between the conductive spacer and the sidewall of the bottom electrode. An upper portion of the metal silicide layer is a metal silicide nitride layer containing more nitrogen than a lower portion of the metal silicide layer.

In another embodiment, the metal silicide layer is between the bottom electrode and the diode pattern.

In another embodiment, a bottom surface of the metal silicide layer is recessed into the diode pattern below an upper surface of the diode pattern.

In another embodiment, the conductive spacer contacts a portion of the diode pattern, and the conductive spacer comprises a same conductivity type as the contacted portion of the diode pattern.

In another embodiment, the conductive spacer comprises silicon (Si), and the nitride spacer comprises silicon nitride.

Specific details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
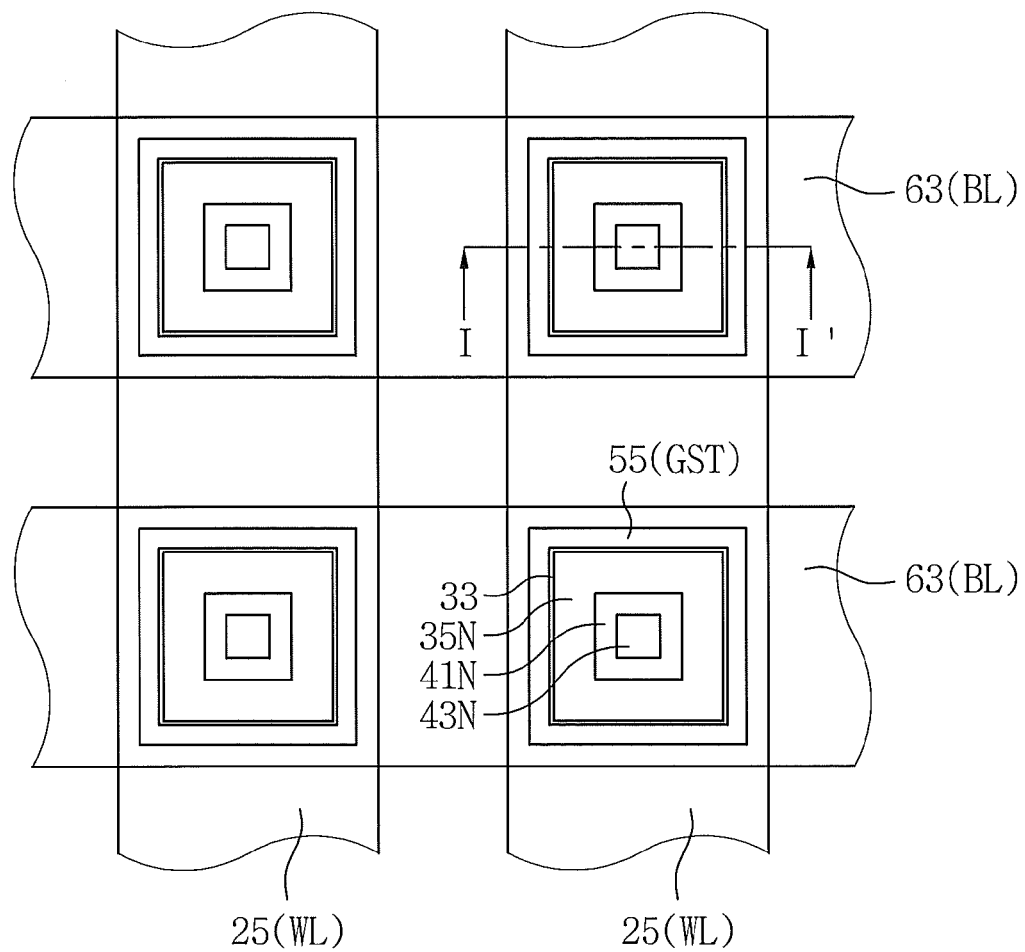
FIG. 1 is a layout diagram of a non-volatile semiconductor device according to first embodiments of the inventive concept.

Various embodiments will now be described more fully with reference to the accompanying drawings in which some embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. Like numbers refer to like elements throughout.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

Spatially relative terms, such as "top end", "bottom end", "top surface", "bottom surface", "upper", "lower", and the like, may be used herein for ease of description to describe one element or feature's relationship to another element(s) or feature(s) as illustrated in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiment 1

Figure 2:
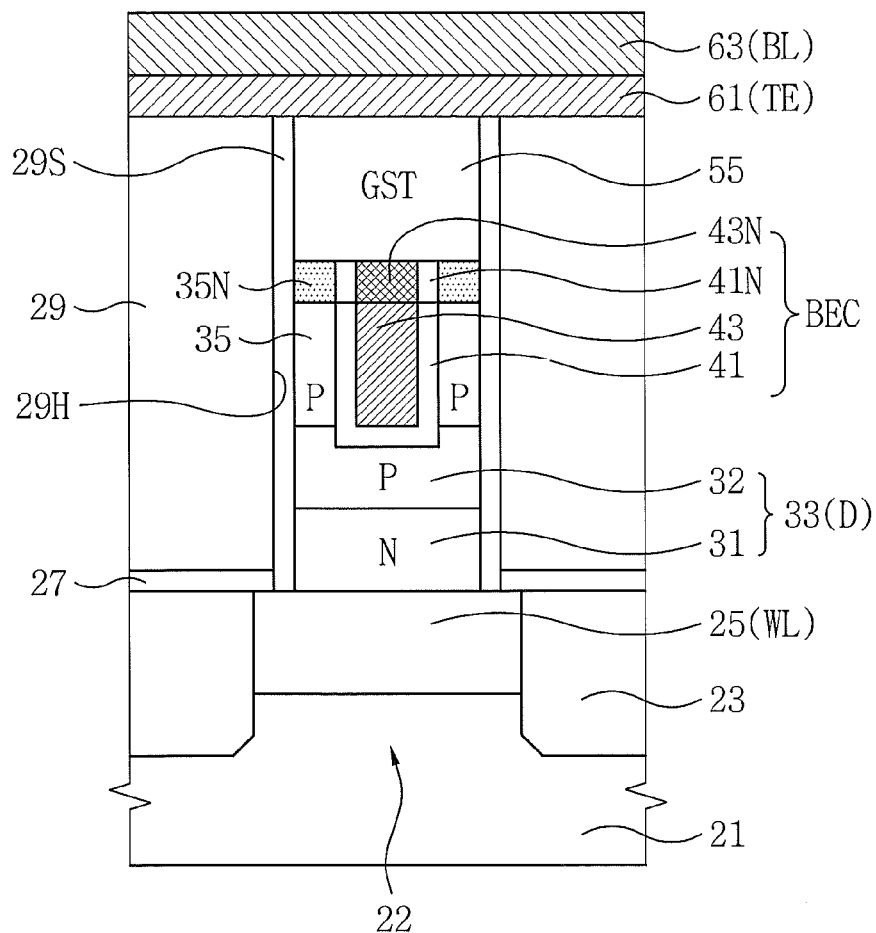
FIG. 2 is a cross-sectional view taken along line I-I' of FIG. 1.
Figure 3:
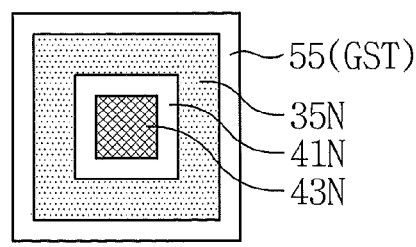
FIG. 3 is a partial layout diagram for explaining the coupling relationship among some components of FIG. 2.

FIG. 1 is a layout diagram of a non-volatile semiconductor device according to first embodiments of the inventive concept, FIG. 2 is a cross-sectional view taken along line I-I' of FIG. 1, and FIG. 3 is a partial layout diagram for explaining the coupling relationship among some components of FIG. 2.

Referring to FIG. 1, bit lines (BLs) 63 may be provided on word lines (WLs) 25 disposed parallel to one another. The BLs 63 may be disposed across the WLs 25. Memory cells 33, 35N, 41N, 43N, and 55 may be disposed at intersections between the WLs 25 and the BLs 63.

Referring to FIG. 2, an isolation layer 23 defining an active region 22 may be disposed in a predetermined region of a semiconductor substrate 21. The WLs 25 may be disposed in the active region 22. An etch stop layer 27 and a lower insulating layer 29 may be sequentially stacked on the WLs 25 and the isolation layer 23. A contact hole 29H may be disposed through the lower insulating layer 29 and the etch stop layer 27 to partially expose the WL 25. An insulating spacer 29S may be disposed on a sidewall of the contact hole 29H. A diode 33 may be disposed within the contact hole 29H. The diode 33 may include a first diode pattern 31 and a second diode pattern 32.

A conductive spacer 35, a metal silicide layer 41, and a bottom electrode 43 and 43N may be disposed on the diode 33. A nitride spacer 35N may be disposed on the conductive spacer 35, and a metal silicide nitride layer 41N may be disposed on the metal silicide layer 41. The bottom electrode 43 and 43N may include a lower part 43, and an upper part 43N disposed on the lower part 43. A resistance changeable element 55 may be disposed on the upper part 43N, the metal silicide nitride layer 41N, and the nitride spacer 35N. The resistance changeable element 55 may fill the contact hole 29H. A top electrode (TE) 61 may be disposed on the resistance changeable element 55. The BL 63 may be connected to the TE 61 and disposed on the lower insulating layer 29.

The semiconductor substrate 21 may be a silicon wafer or a silicon-on-insulator (SOI) wafer. The isolation layer 23 may include a silicon oxide layer, a silicon nitride layer, a silicon oxynitride layer, or a combination thereof. The etch stop layer 27 may include an insulating layer having an etch selectivity with respect to the lower insulating layer 29. For example, the lower insulating layer 29 may be a silicon oxide layer, and the etch stop layer 27 may be a silicon nitride layer. The insulating spacer 29S may serve to reduce a diameter of the contact hole 29H and protect a sidewall of the contact hole 29H. The insulating spacer 29S may include a silicon oxide layer, a silicon nitride layer, a silicon oxynitride layer, or a combination thereof.

The first diode pattern 31 may be interposed between the WL 25 and the second diode pattern 32. The first diode pattern 31 may be in contact with the WL 25. The first diode pattern 31 may include a semiconductor layer of a first conductivity type, and the second diode pattern 32 may include a semiconductor layer of a second conductivity type. When the first conductivity type is an N type, the second conductivity type may be a P type. When the first conductivity type is a P type, the second conductivity type may be an N type. For example, the semiconductor substrate 21 may be a P-type silicon substrate, the WL 25 may include an N-type silicon layer, the first diode pattern 31 may be an N-type silicon layer, and the second diode pattern 32 may be a P-type silicon layer.

The bottom electrode 43 and 43N, the metal silicide layer 41, the metal silicide nitride layer 41N, the conductive spacer 35, the nitride spacer 35N, and the resistance changeable element 55 may be confined within the contact hole 29H. The nitride spacer 35N may be self-aligned with the conductive spacer 35, the metal silicide nitride layer 41N may be self-aligned with the metal silicide layer 41, and the upper part 43N may be self-aligned with the lower part 43. The bottom electrode 43 and 43N, the metal silicide layer 41, and the metal silicide nitride layer 41N may constitute a bottom electrode contact (BEC) structure.

The conductive spacer 35 may cover the sidewall of the contact hole 29H. The conductive spacer 35 may be in contact with the second diode pattern 32. The conductive spacer 35 may include a semiconductor layer of the second conductivity type. That is, the conductive spacer 35 may include a semiconductor layer of the same conductivity type as the second diode pattern 32. For example, when the second diode pattern 32 includes a P-type silicon layer, the conductive spacer 35 may also be a P-type silicon layer. The metal silicide layer 41 may cover a sidewall and bottom surface of the lower part 43. The metal silicide layer 41 may be interposed between the lower part 43 and the conductive spacer 35. The metal silicide layer 41 may be in contact with the conductive spacer 35 and the second diode pattern 32. A bottom surface of the metal silicide layer 41 may be lower than a top surface of the second diode pattern 32.

The lower part 43 may include a titanium (Ti) layer, a titanium nitride (TiN) layer, a titanium aluminum nitride (TiAlN) layer, a titanium silicon nitride (TiSiN) layer, a titanium carbon nitride (TiCN) layer, a tantalum (Ta) layer, a tantalum nitride (TaN) layer, a tantalum aluminum nitride (TaAlN) layer, a tantalum silicon nitride (TaSiN) layer, a tantalum carbon nitride (TaCN) layer, a cobalt (Co) layer, a cobalt silicon nitride (CoSiN) layer, a tungsten (W) layer, a tungsten nitride (WN) layer, a tungsten silicon nitride (WSiN) layer, a nickel (Ni) layer, a nickel silicon (NiSi) layer, a carbon (C) layer, a carbon nitride (CN) layer, or a combination thereof. The metal silicide layer 41 may include a TiSi layer, a TaSi layer, a CoSi layer, a NiSi layer, a WSi layer, or a combination thereof. The nitride spacer 35N may be a nitride of a conductive material of the conductive spacer 35. For example, when the conductive spacer 35 includes a silicon layer, the nitride spacer 35N may be a silicon nitride layer. The metal silicide nitride layer 41N may be a nitride of a metal silicide of the metal silicide layer 41. The metal silicide nitride layer 41N may include a TiSiN layer, a TaSiN layer, a CoSiN layer, a NiSiN layer, a WSiN layer, or a combination thereof. The upper part 43N may be a nitride of a material of the lower part 43. The upper part 43N may be a nitrogen (N)-rich electrode. The upper part 43N may contain a larger amount of nitrogen than the lower part 43. In other words, the lower part 43 of the bottom electrode 43 and 43N may contain a smaller amount of nitrogen than the upper part 43N thereof. The upper part 43N may include a TiN layer, a TiAlN layer, a TiSiN layer, a TiCN layer, a TaN layer, a TaAlN layer, a TaSiN layer, a TaCN layer, a CoN layer, a CoSiN layer, a WN layer, a WSiN layer, a NiN layer, a NiSiN layer, a CN layer, or a combination thereof.

The metal silicide layer 41 may function as an ohmic contact between the second diode pattern 32 and the lower part 43. Also, the metal silicide layer 41 may function as an ohmic contact between the conductive spacer 35 and the lower part 43. As a result, the bottom electrode 43 and 43N may be electrically connected to the second diode pattern 32 through the metal silicide layer 41. The bottom electrode 43 and 43N may be electrically connected to the second diode pattern 32 through the metal silicide layer 41 and the conductive spacer 35. A sidewall of the lower part 43 may overlap the conductive spacer 35. The length by which the lower part 43 overlaps the conductive spacer 35 may be greater than the diameter of the lower part 43. As a result, current drivability between the bottom electrode 43 and 43N and the second diode pattern 32 may be markedly increased.

The resistance changeable element 55 may be in contact with the upper part 43N and the metal silicide nitride layer 41N. The resistance changeable element 55 may include a phase-change material layer, a transition metal oxide (TMO) layer, a solid electrolyte layer, or a polymer layer. For example, the resistance changeable element 55 may include a phase-change material layer, such as a germanium-antimony-tellurium (GeSbTe) layer, a GeTeAs layer, a SnTeSn layer, a GeTe layer, a SbTe layer, a selenium-Te—Sn (SeTeSn) layer, a GeTeSe layer, a Sb—Se-bismuth (SbSeBi) layer, a GeBiTe layer, a GeTeTi layer, an indium-Se (InSe) layer, a GaTeSe layer, an InSbTe layer, or a combination thereof. Furthermore, the resistance changeable element 55 may include a material layer obtained by adding C, Si, O, or N to the phase-change material layer.

According to other embodiments, the metal silicide layer 41 and the metal silicide nitride layer 41N may be omitted.

The TE 61 may be in contact with the resistance changeable element 55. The TE 61 may include a metal layer, such as a TiN layer. The BL 63 may be in contact with the TE 61. The BL 63 may include a metal layer. According to some embodiments, the TE 61 may be omitted.

Referring to FIG. 3, the nitride spacer 35N may be disposed to surround the upper part 43N of the bottom electrode 43 and 43N. The metal silicide nitride layer 41N may be interposed between the nitride spacer 35N and the upper part 43N. The resistance changeable element 55 may cover the upper part 43N, the metal silicide nitride layer 41N, and the nitride spacer 35N. The nitride spacer 35N may function as an insulating layer.

Embodiment 2

FIGS. 4 through 16 are cross-sectional views and partial layout diagrams of a non-volatile memory device according to second embodiments of the inventive concept.

Figure 4:
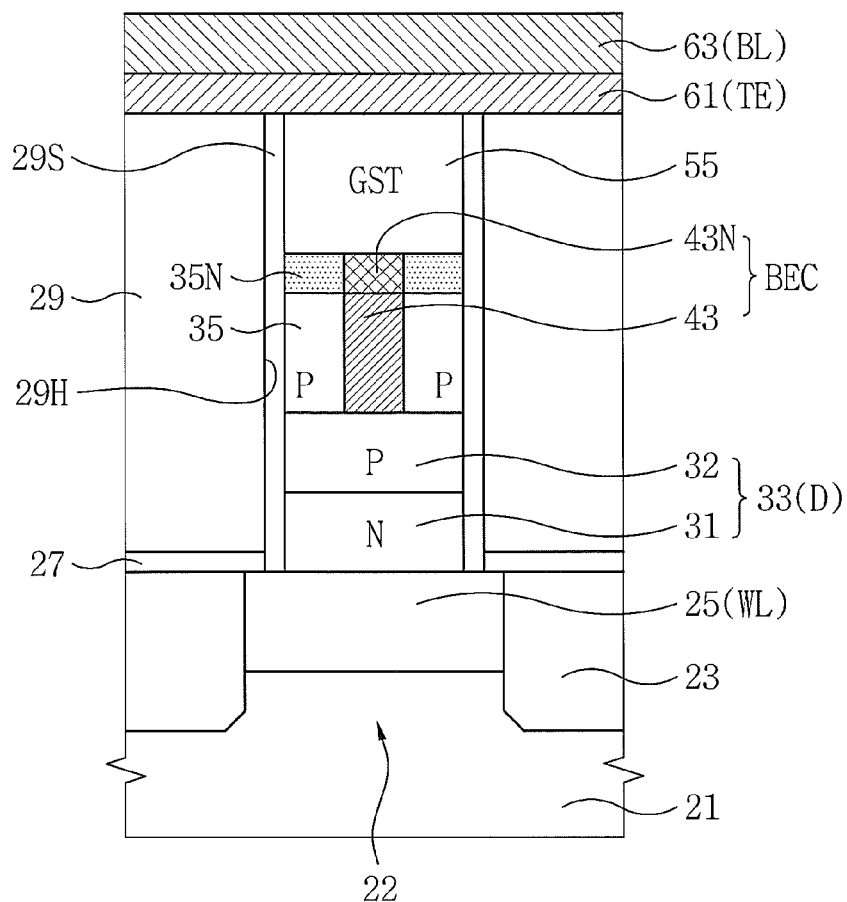
FIGS. 4 through 16 are cross-sectional views and partial layout diagrams of a non-volatile memory device according to second embodiments of the inventive concept.

Referring to FIG. 4, a lower part 43 of a bottom electrode 43 and 43N may be in contact with a conductive spacer 35 and a second diode pattern 32. An upper part 43N may be disposed on the lower part 43, and a nitride spacer 35N may be disposed on the conductive spacer 35. The nitride spacer 35N and the upper part 43N may be in contact with each other. The upper part 43N may be an N-rich electrode.

Figure 5:
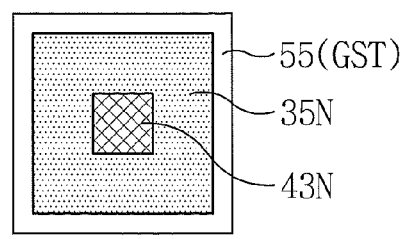

FIG. 5 is a partial layout diagram for explaining the coupling relationship among the nitride spacer 35N, the upper part 43N of the bottom electrode 43 and 43N, and the resistance changeable element 55 of FIG. 4. Referring to FIG. 5, the nitride spacer 35N may be disposed to surround the upper part 43N. The resistance changeable element 55 may cover the upper part 43N and the nitride spacer 35N. The nitride spacer 35N may serve as an insulating layer.

Figure 6:
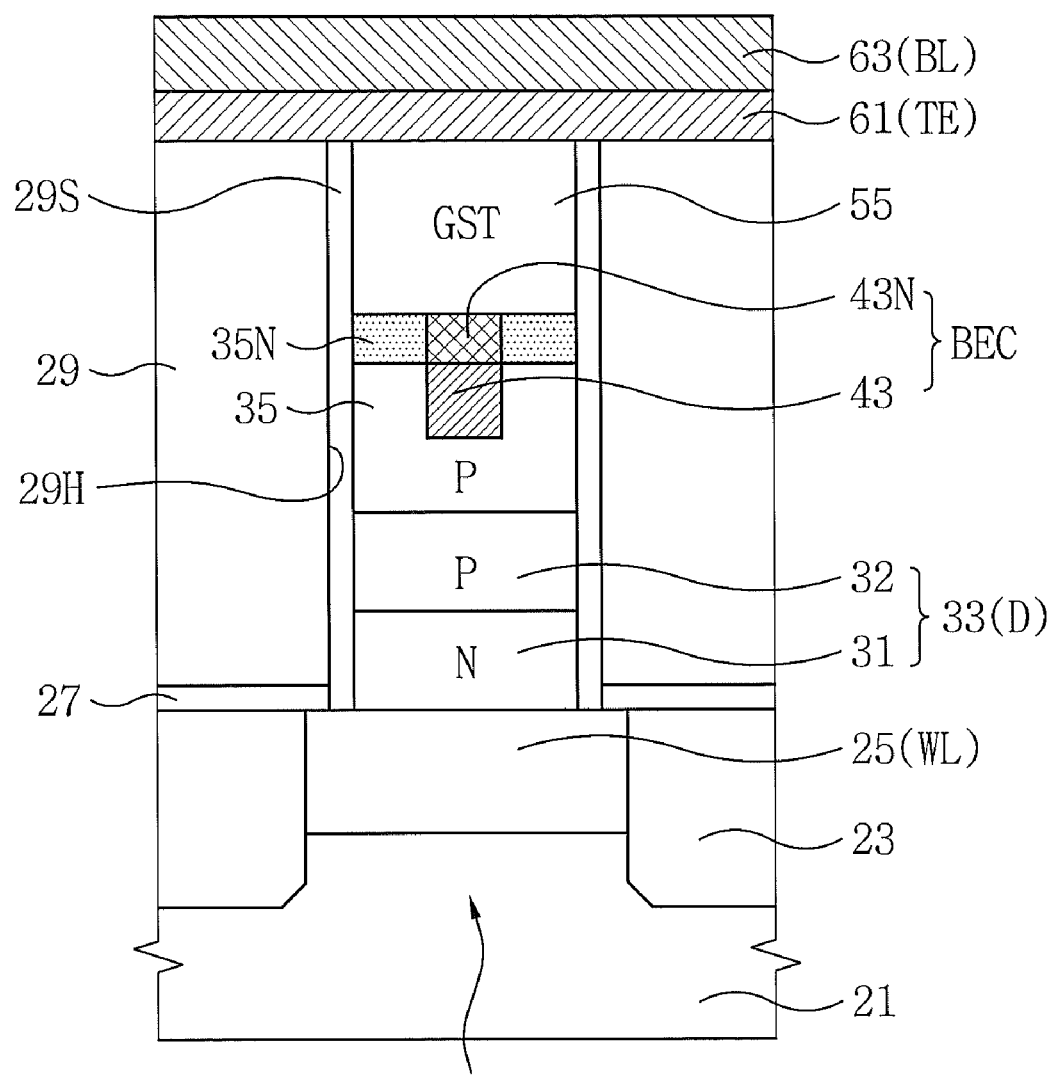

Referring to FIG. 6, the conductive spacer 35 may cover a sidewall and bottom surface of the lower part 43. The lower part 43 may be electrically connected to the second diode pattern 32 through the conductive spacer 35. The conductive spacer 35 may be in contact with the second diode pattern 32.

Figure 7:
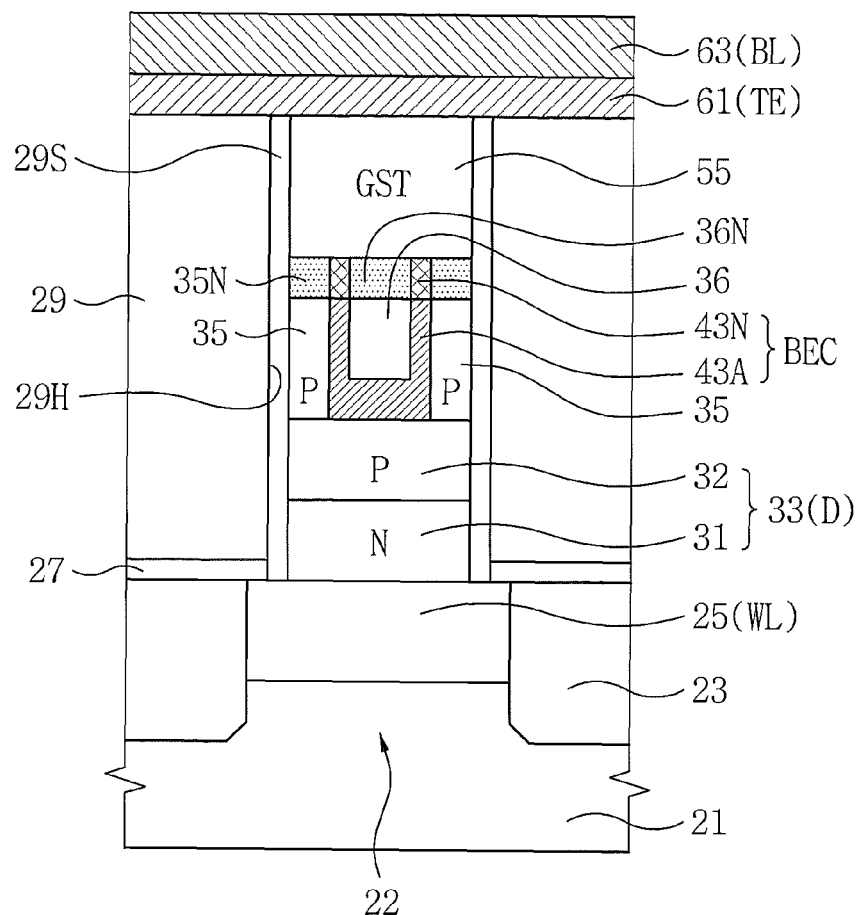

Referring to FIG. 7, a bottom electrode 43A and 43N, a core layer 36, a core nitride layer 36N, a conductive spacer 35, and a nitride spacer 35N may be provided. A lower part 43A of the bottom electrode 43A and 43N may cover a sidewall and bottom surface of the core layer 36. The conductive spacer 35 may be interposed between the lower part 43A and an insulating spacer 29S. The core nitride layer 36N may be formed on the core layer 36, an upper part 43N may be formed on the lower part 43A, and the nitride spacer 35N may be formed on the conductive spacer 35. The core layer 36 may include a silicon layer. In this case, the core nitride layer 36N may be a silicon nitride layer.

Figure 8:
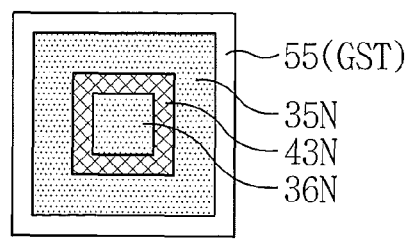

FIG. 8 is a partial layout diagram for explaining the coupling relationship among the core nitride layer 36N, the nitride spacer 35N, the upper part 43N of the bottom electrode 43A and 43N, and the resistance changeable element 55 of FIG. 7. Referring to FIG. 8, the upper part 43N of the bottom electrode 43A and 43N may be disposed to surround the core nitride layer 36N. The upper part 43N may be interposed between the core nitride layer 36N and the nitride spacer 35N. The upper part 43N may have a rectangular ring shape. According to other embodiments, the upper part 43N may have a circular ring shape.

Figure 9:
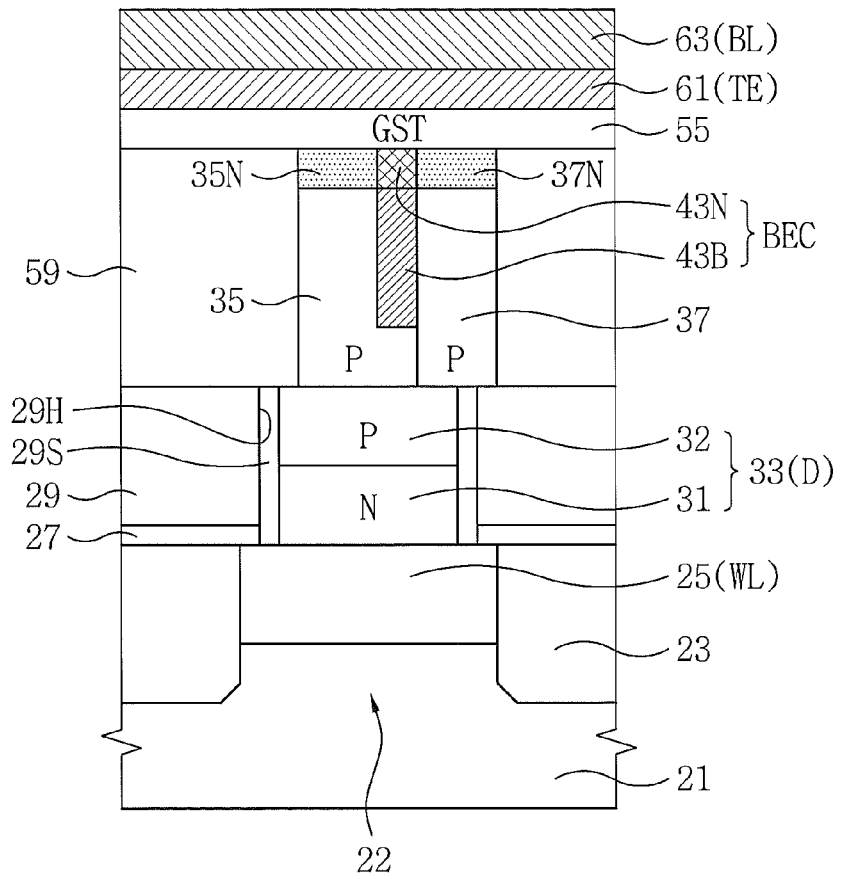

Referring to FIG. 9, top surfaces of a second diode pattern 32 and a lower insulating layer 29 may be planarized to have substantially the same level. An upper insulating layer 59 may be disposed on the second diode pattern 32 and the lower insulating layer 29. A conductive spacer 35 may contact the second diode pattern 32 through the upper insulating layer 59. A lower part 43B of a bottom electrode 43B and 43N may be disposed on a sidewall of the conductive spacer 35. A gap fill layer 37 may be disposed on a sidewall of the lower part 43B. A nitride spacer 35N may be disposed on the conductive spacer 35. An upper part 43N may be disposed on the lower part 43B of the bottom electrode 43B and 43N. A gap fill nitride layer 37N may be disposed on the gap fill layer 37. A resistance changeable element 55 may be disposed on the upper part 43N, the nitride spacer 35N, and the gap fill nitride layer 37N. A TE 61 and a BL 63 may be disposed on the resistance changeable element 55.

The conductive spacer 35 may extend under a bottom surface of the lower part 43B. The conductive spacer 35 may be in contact with the gap fill layer 37. The gap fill layer 37 may be in contact with the second diode pattern 32. The gap fill layer 37 may include a semiconductor layer of the same conductivity type as the second diode pattern 32. For example, the gap fill layer 37 may be a P-type silicon layer. The gap fill nitride layer 37N may be a nitride layer of a material of the gap fill layer 37. The gap fill nitride layer 37N may be a silicon nitride layer. Top surfaces of the upper insulating layer 59, the nitride spacer 35N, the upper part 43N, and the gap fill nitride layer 37N may be planarized to have substantially the same level.

Figure 10:
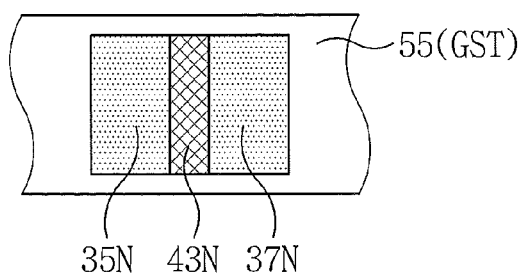

FIG. 10 is a partial layout diagram for explaining the coupling relationship among the gap fill nitride layer 37N, the nitride spacer 35N, the upper part 43N of the bottom electrode 43B and 43N, and the resistance changeable element 55 of FIG. 9. Referring to FIG. 10, the upper part 43N may have a bar shape. The upper part 43N may be interposed between the nitride spacer 35N and the gap fill nitride layer 37N. The resistance changeable element 55 may cover the nitride spacer 35N, the upper part 43N, and the gap fill nitride layer 37N. The resistance changeable element 55 may have a line shape.

Figure 11:
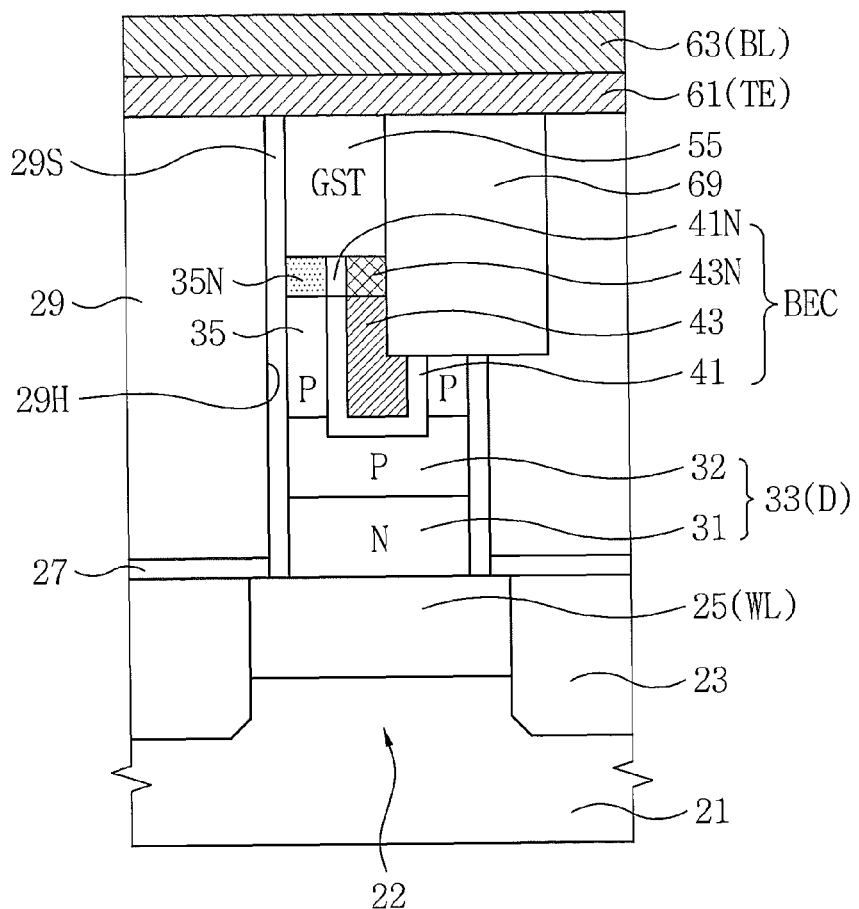

Referring to FIG. 11, an upper insulating pattern 69 may be provided. The upper insulating pattern 69 may fill a trench formed by patterning a resistance changeable element 55, a bottom electrode 43 and 43N, a metal silicide nitride layer 41N, a metal silicide layer 41, a nitride spacer 35N, a conductive spacer 35, an insulating spacer 29S, and a lower insulating layer 29. The upper insulating pattern 69 may include a silicon oxide layer, a silicon nitride layer, a silicon oxynitride layer, or a combination thereof.

Figure 12:
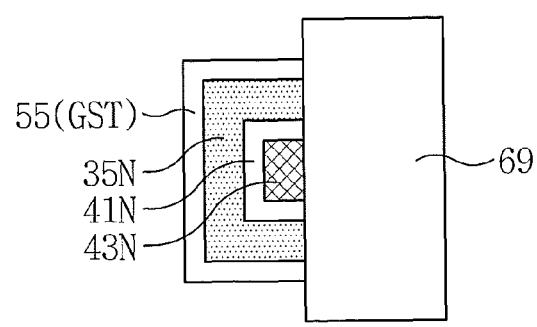

FIG. 12 is a partial layout diagram for explaining the coupling relationship among the upper insulating pattern 69, the nitride spacer 35N, the upper part 43N of the bottom electrode 43 and 43N, and the resistance changeable element 55 of FIG. 11. Referring to FIG. 12, the upper part 43N of the bottom electrode 43 and 43N may be in contact with the upper insulating pattern 69. The upper part 43N may be surrounded by the metal silicide nitride layer 41N and the upper insulating pattern 69. Sidewalls of the nitride spacer 35N and the metal silicide nitride layer 41N may be in contact with the upper insulating pattern 69.

Figure 13:
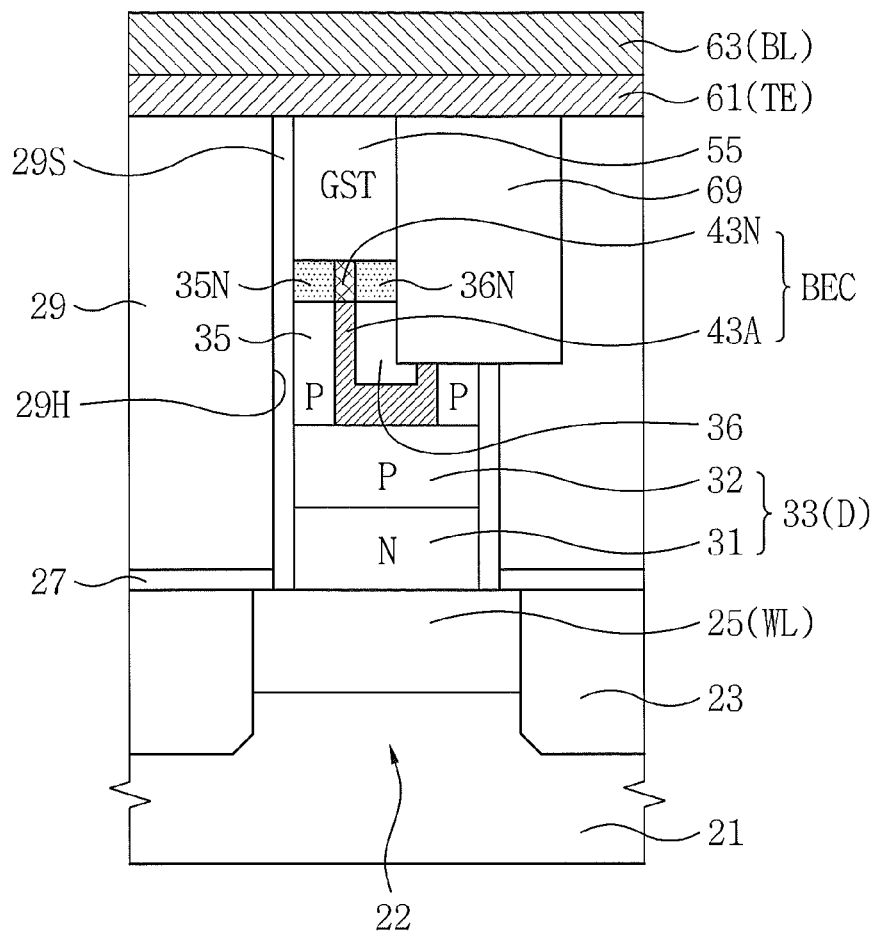

Referring to FIG. 13, an upper insulating pattern 69 may be provided to fill a trench formed by patterning a resistance changeable element 55, a bottom electrode 43A and 43N, a core nitride layer 36N, a core layer 36, a nitride spacer 35N, a conductive spacer 35, an insulating spacer 29S, and a lower insulating layer 29.

Figure 14:
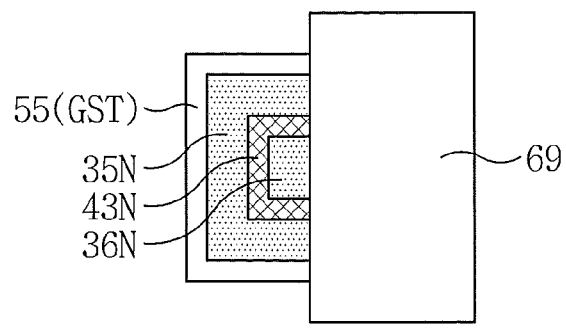

FIG. 14 is a partial layout diagram for explaining the coupling relationship among the upper insulating pattern 69, the core nitride layer 36N, the nitride spacer 35N, the upper part 43N of the bottom electrode 43A and 43N, and the resistance changeable element 55 of FIG. 13. Referring to FIG. 14, the core nitride layer 36N may be in contact with the upper insulating pattern 69. The upper part 43N of the bottom electrode 43A and 43N may also be in contact with the upper insulating pattern 69. The core nitride layer 36N may be surrounded by the upper insulating pattern 69 and the upper part 43N. A sidewall of the nitride spacer 35N may be in contact with the upper insulating pattern 69.

Figure 15:
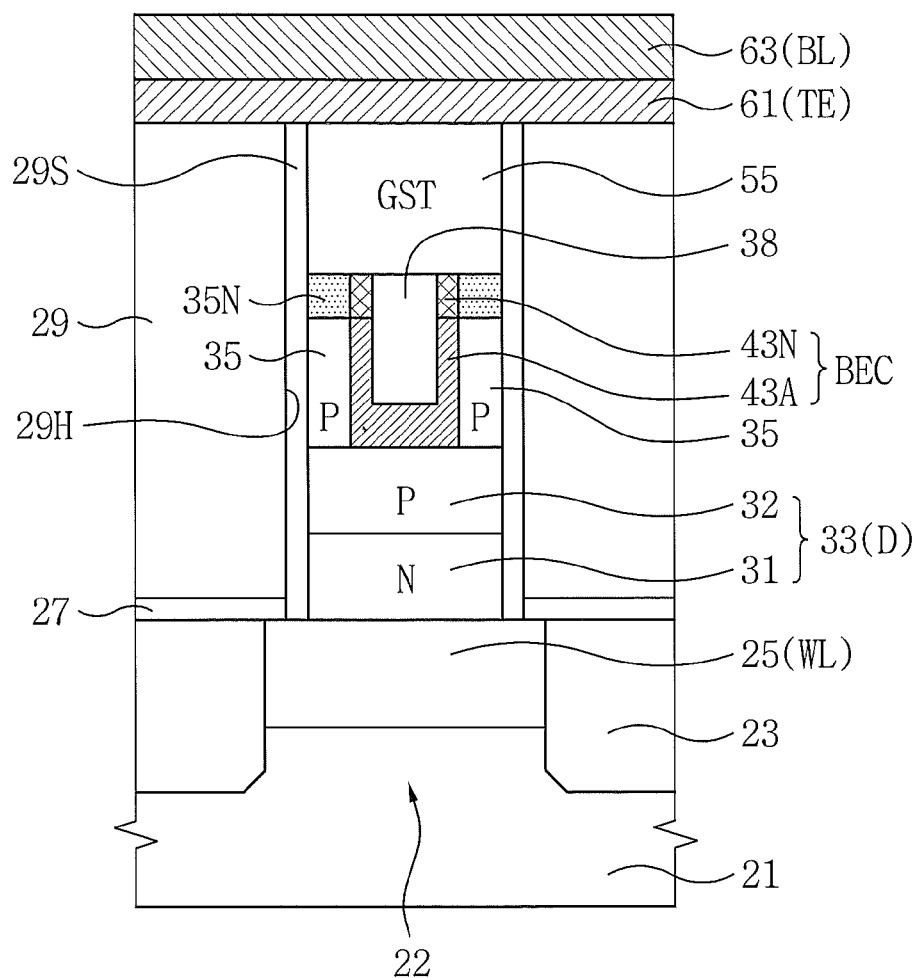

Referring to FIG. 15, a bottom electrode 43A and 43N, a core layer 38, a conductive spacer 35, and a nitride spacer 35N may be provided. The bottom electrode 43A and 43N may cover a sidewall and bottom surface of the core layer 38. The core layer 38 may include a silicon oxide layer, a silicon nitride layer, a silicon oxynitride layer, or a combination thereof.

Figure 16:
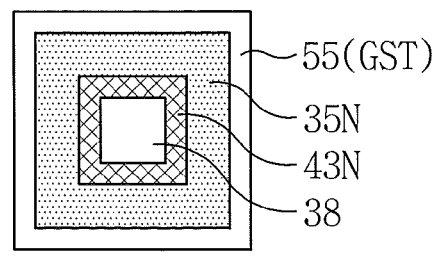

FIG. 16 is a partial layout diagram for explaining the coupling relationship between the core layer 38, the nitride spacer 35N, an upper part 43N of the bottom electrode 43A and 43N, and the resistance changeable element 55 of FIG. 16. Referring to FIG. 16, the upper part 43N of the bottom electrode 43A and 43N may be disposed to surround the core layer 38. The upper part 43N may be interposed between the core layer 38 and the nitride spacer 35N.

Embodiment 3

Figure 17:
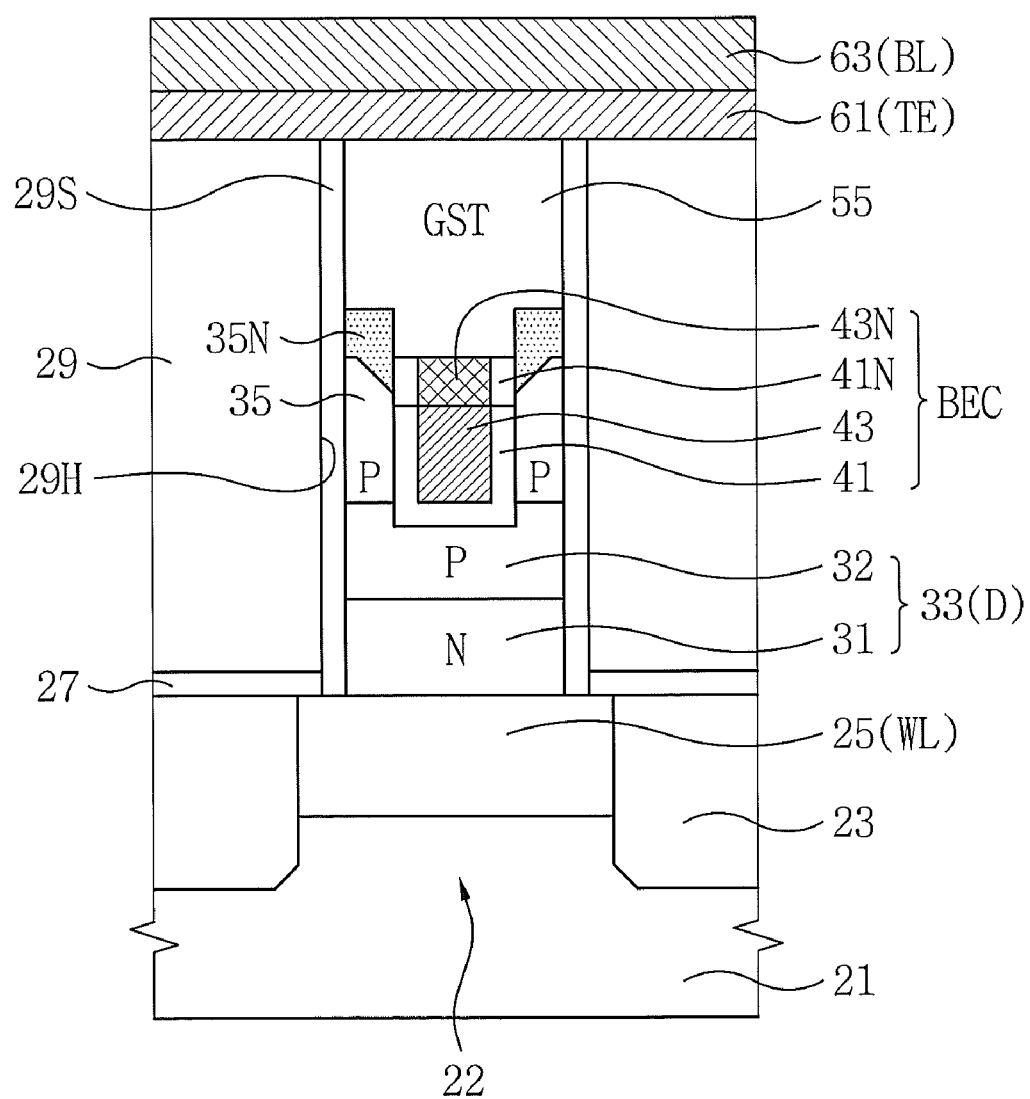
FIGS. 17 through 19 are cross-sectional views of a non-volatile memory device according to third embodiments of the inventive concept.
Figure 18:
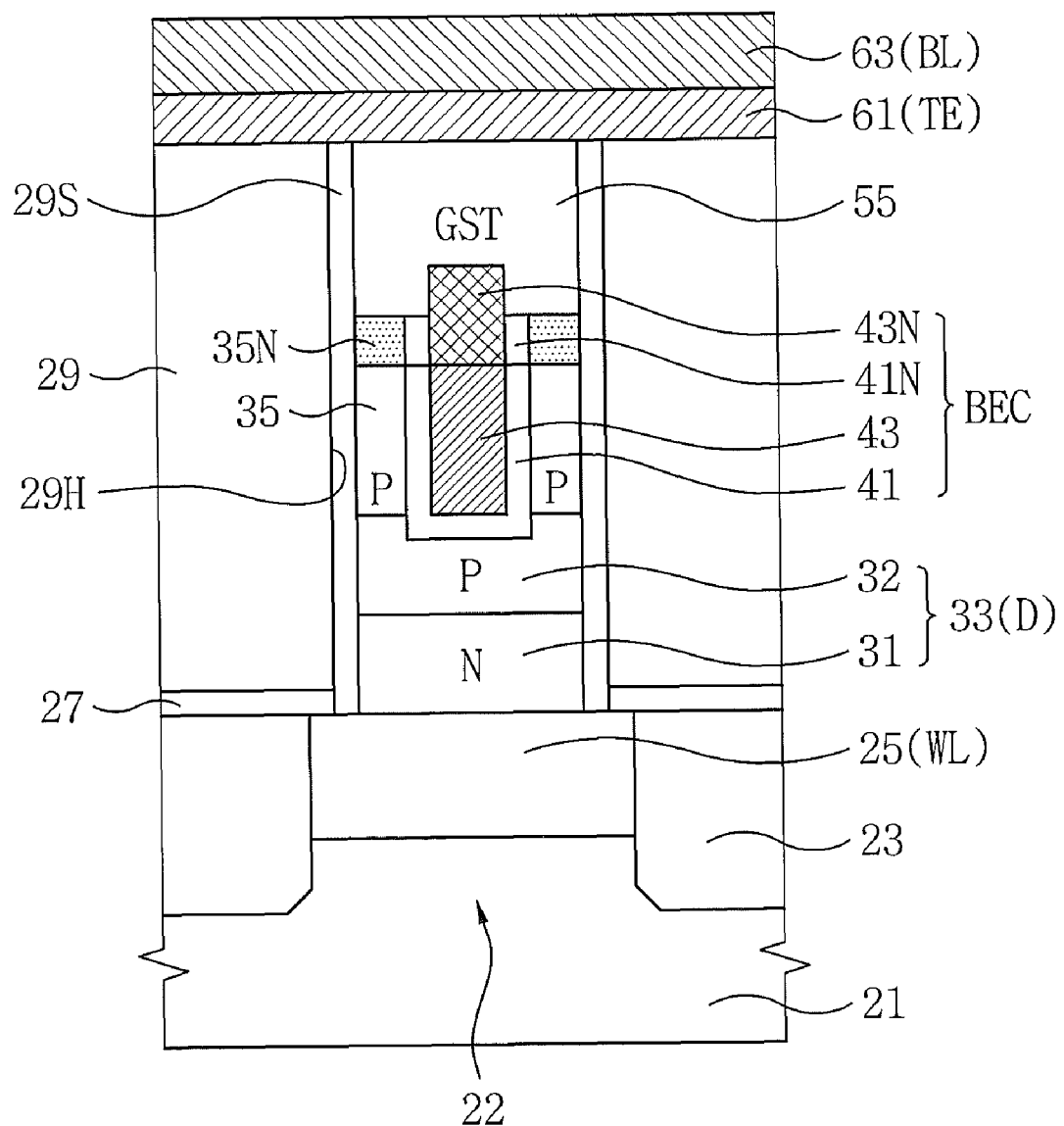
Figure 19:
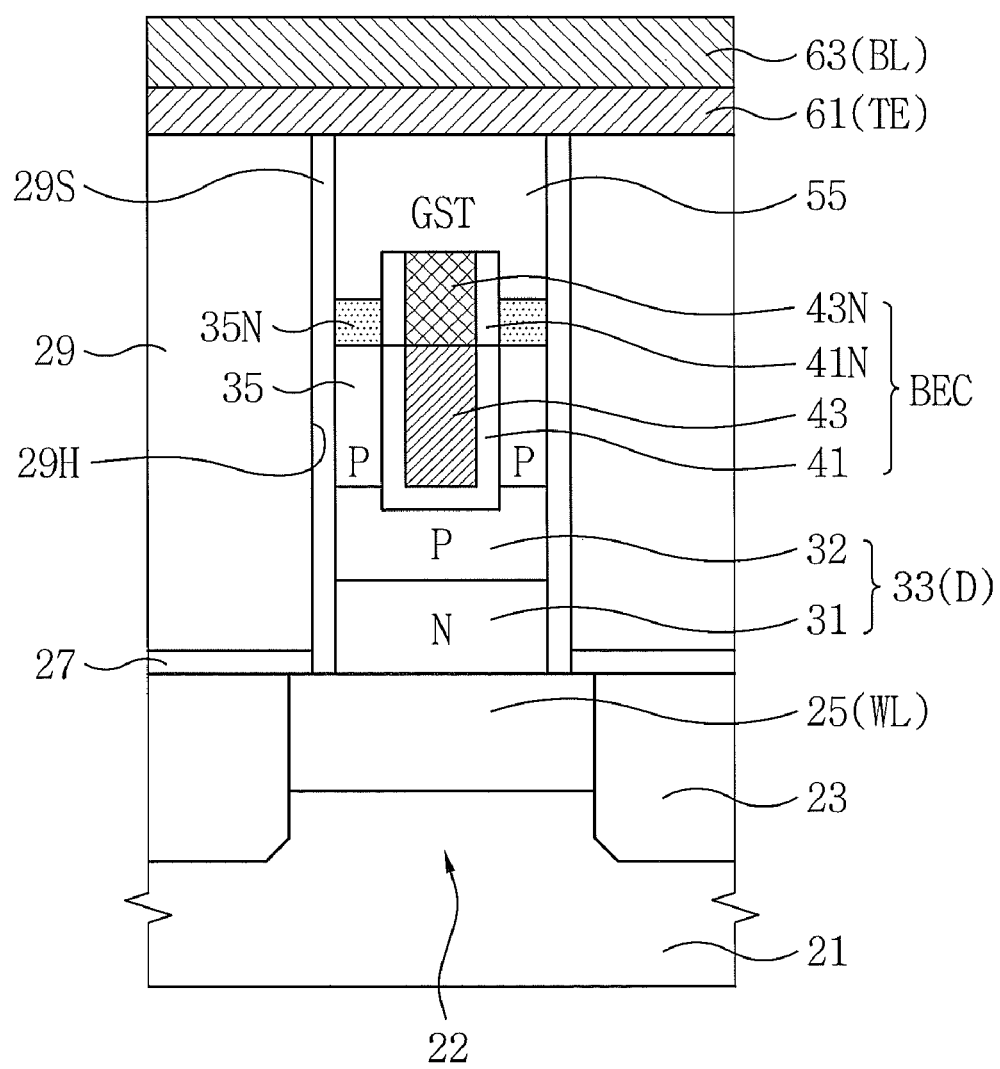

FIGS. 17 through 19 are cross-sectional views of a non-volatile memory device according to third embodiments of the inventive concept.

Referring to FIG. 17, an isolation layer 23, a WL 25, an etch stop layer 27, a lower insulating layer 29, a contact hole 29H, an insulating spacer 29S, a diode 33, a conductive spacer 35, a nitride spacer 35N, a metal silicide layer 41, a metal silicide nitride layer 41N, a bottom electrode 43 and 43N, a resistance changeable element 55, a TE 61, and a BL 63 may be disposed on a semiconductor substrate 21. The bottom electrode 43 and 43N may include a lower part 43, and an upper part 43N disposed on the lower part 43.

The upper part 43N and the metal silicide nitride layer 41N may be formed at a lower level than a top surface of the nitride spacer 35N. The resistance changeable element 55 may be in contact with the upper part 43N and the metal silicide nitride layer 41N. The resistance changeable element 55 may be in contact with a sidewall of the nitride spacer 35N.

Referring to FIG. 18, the nitride spacer 35N and the metal silicide nitride layer 41N may be formed at a lower level than a top surface of the bottom electrode 43 and 43N. The resistance changeable element 55 may be in contact with a sidewall and top surface of the upper part 43N.

Referring to FIG. 19, the nitride spacer 35N may be formed at a lower level than the top surface of the bottom electrode 43 and 43N and a top surface of the metal silicide nitride layer 41N. The resistance changeable element 55 may be in contact with a sidewall of the metal silicide nitride layer 41N and the top surface of the upper part 43N.

Embodiment 4

FIGS. 20 through 25 are cross-sectional views illustrating a method of fabricating a non-volatile memory device according to fourth embodiments of the inventive concept.

Figure 20:
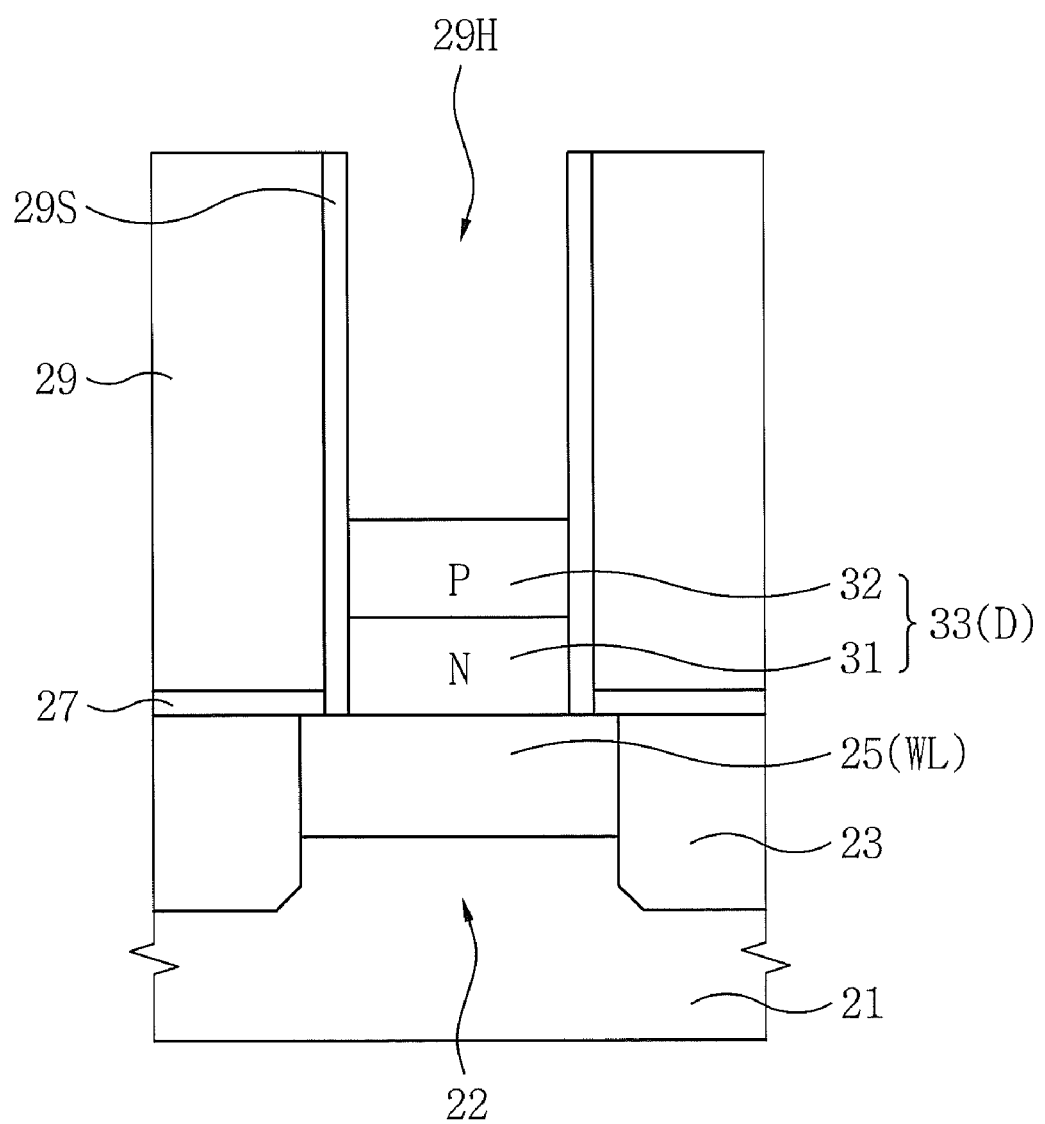
FIGS. 20 through 25 are cross-sectional views illustrating a method of fabricating a non-volatile memory device according to fourth embodiments of the inventive concept.

Referring to FIG. 20, an isolation layer 23 defining an active region 22 may be formed in a predetermined region of a semiconductor substrate 21. Impurities may be implanted into the active region 22, thereby forming a WL 25. An etch stop layer 27 and a lower insulating layer 29 may be sequentially formed on the WL 25 and the isolation layer 23. A contact hole 29H may be formed to partially expose the WL 25 through the lower insulating layer 29 and the etch stop layer 27. An insulating spacer 29S may be formed on a sidewall of the contact hole 29H. A diode 33 may be formed within the contact hole 29H. The diode 33 may include a first diode pattern 31 and a second diode pattern 32.

Figure 21:
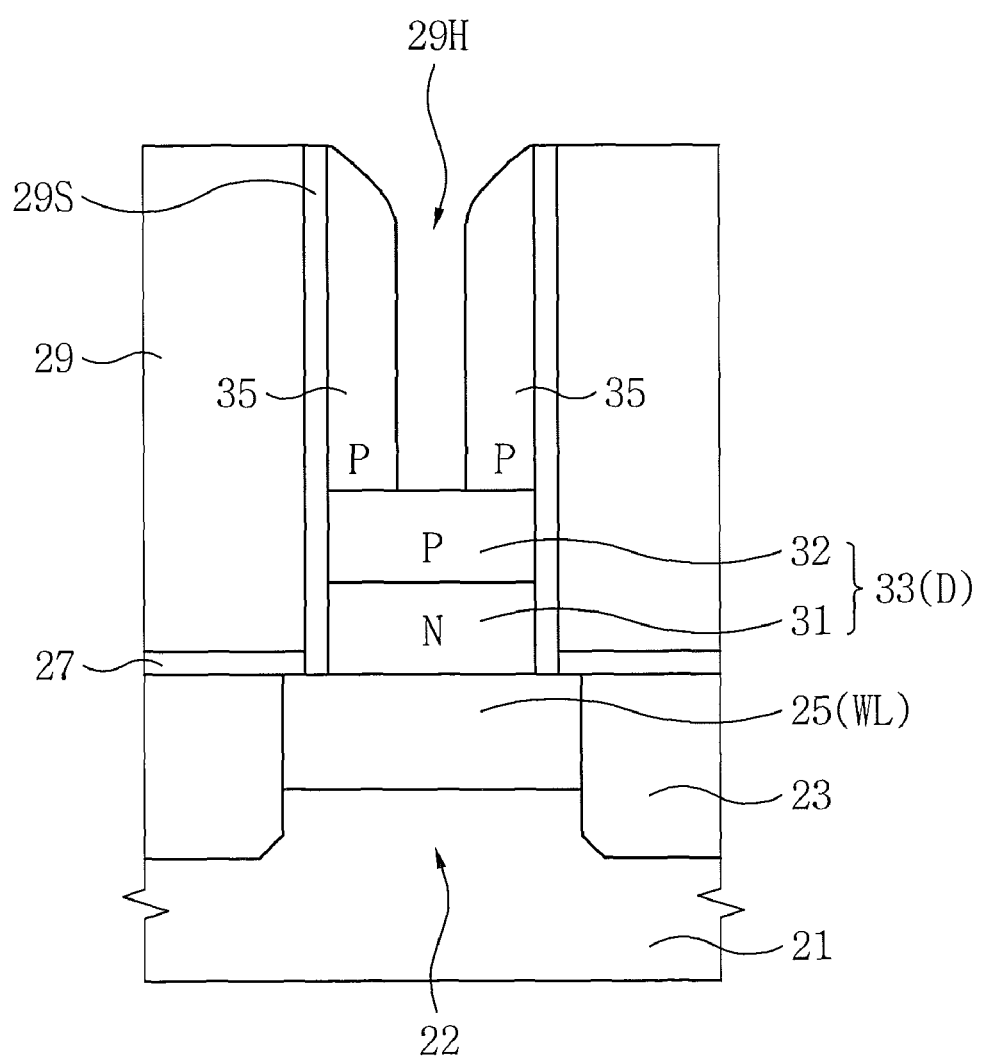

Referring to FIG. 21, a conductive spacer 35 may be formed on the diode 33. The conductive spacer 35 may cover a sidewall of the contact hole 29H. The formation of the conductive spacer 35 may include a thin layer-forming process and an anisotropic etching process. The second diode 32 may be exposed through the bottom of the contact hole 29H.

According to other embodiments, the second diode pattern 32 may be recessed downward from the bottom of the contact hole 29H.

Figure 22:
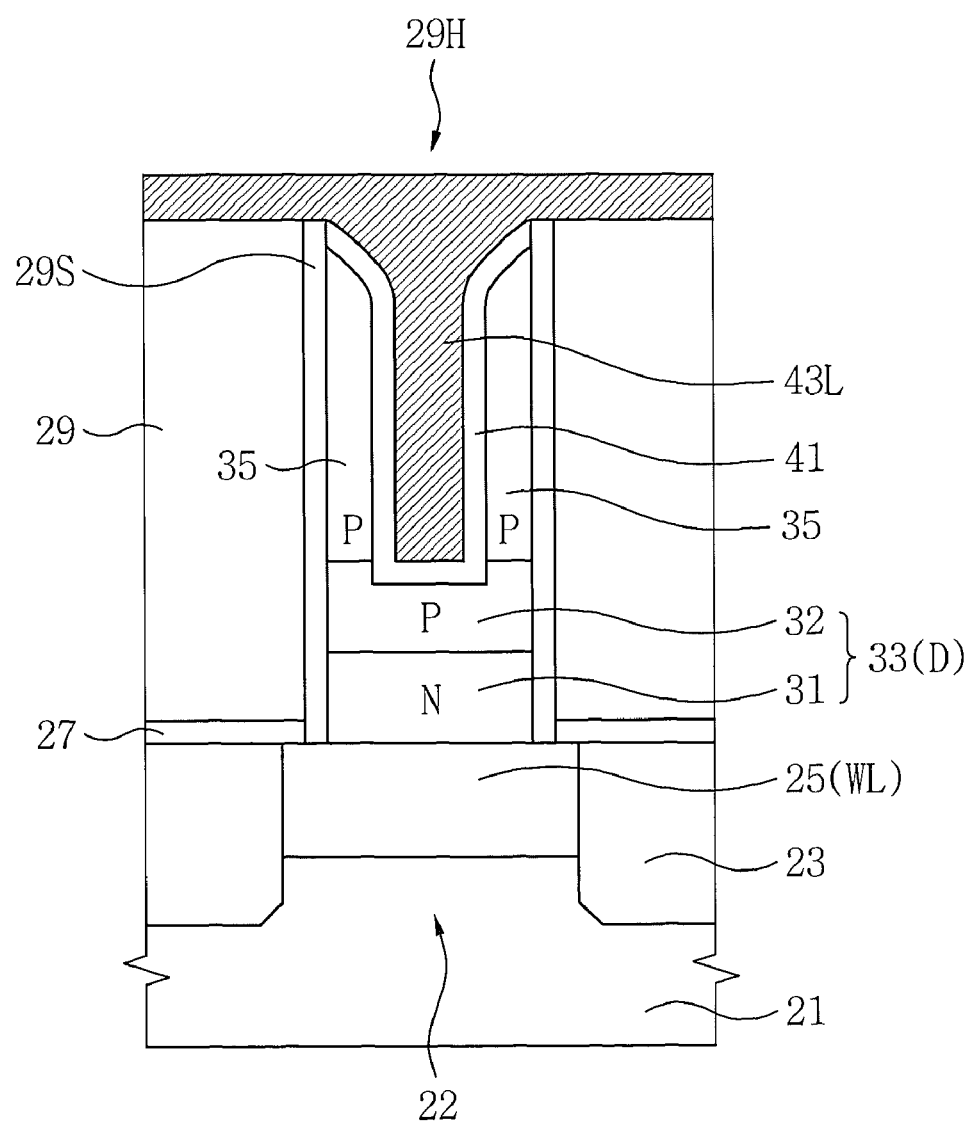

Referring to FIG. 22, a metal silicide layer 41 and a bottom electrode layer 43L may be formed within the contact hole 29H. The bottom electrode layer 43L may completely fill the contact hole 29H. During the formation of the bottom electrode layer 43L, the metal silicide layer 41 may be formed between the conductive spacer 35 and the bottom electrode layer 43L. Also, the metal silicide layer 41 may be formed between the second diode pattern 32 and the bottom electrode layer 43L. The metal silicide layer 41 may serve as an ohmic contact between the second diode pattern 32 and the bottom electrode layer 43L.

Figure 23:
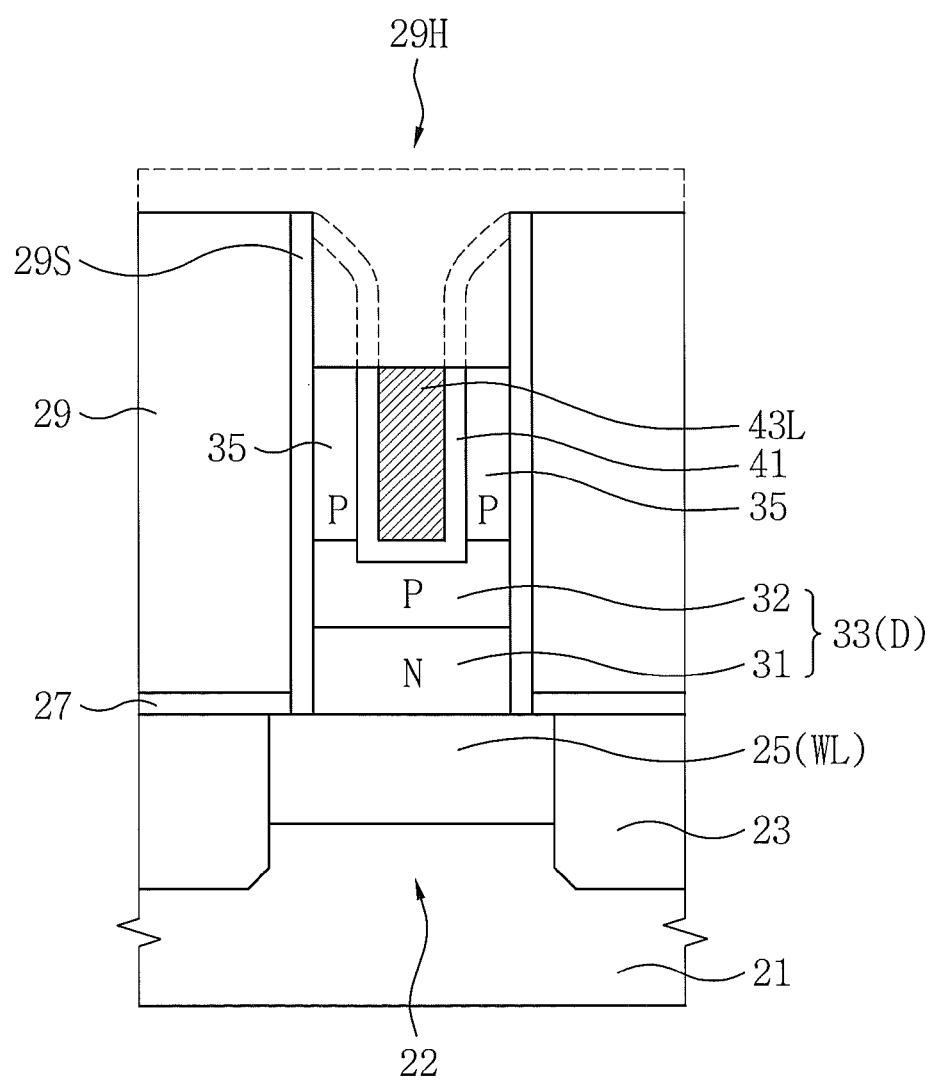

Referring to FIG. 23, the bottom electrode layer 43L, the metal silicide layer 41, and the conductive spacer 35 may be partially removed. As a result, the bottom electrode layer 43L, the metal silicide layer 41, and the conductive spacer 35 may be confined within the contact hole 29H at an intermediate level of the contact hole 29H. That is, top surfaces of the bottom electrode layer 43L, the metal silicide layer 41, and the conductive spacer 35 may be exposed at a lower level than a top surface of the lower insulating layer 29. The partial removal of the bottom electrode layer 43L, the metal silicide layer 41, and the conductive spacer 35 may be performed using an etchback process.

Figure 24:
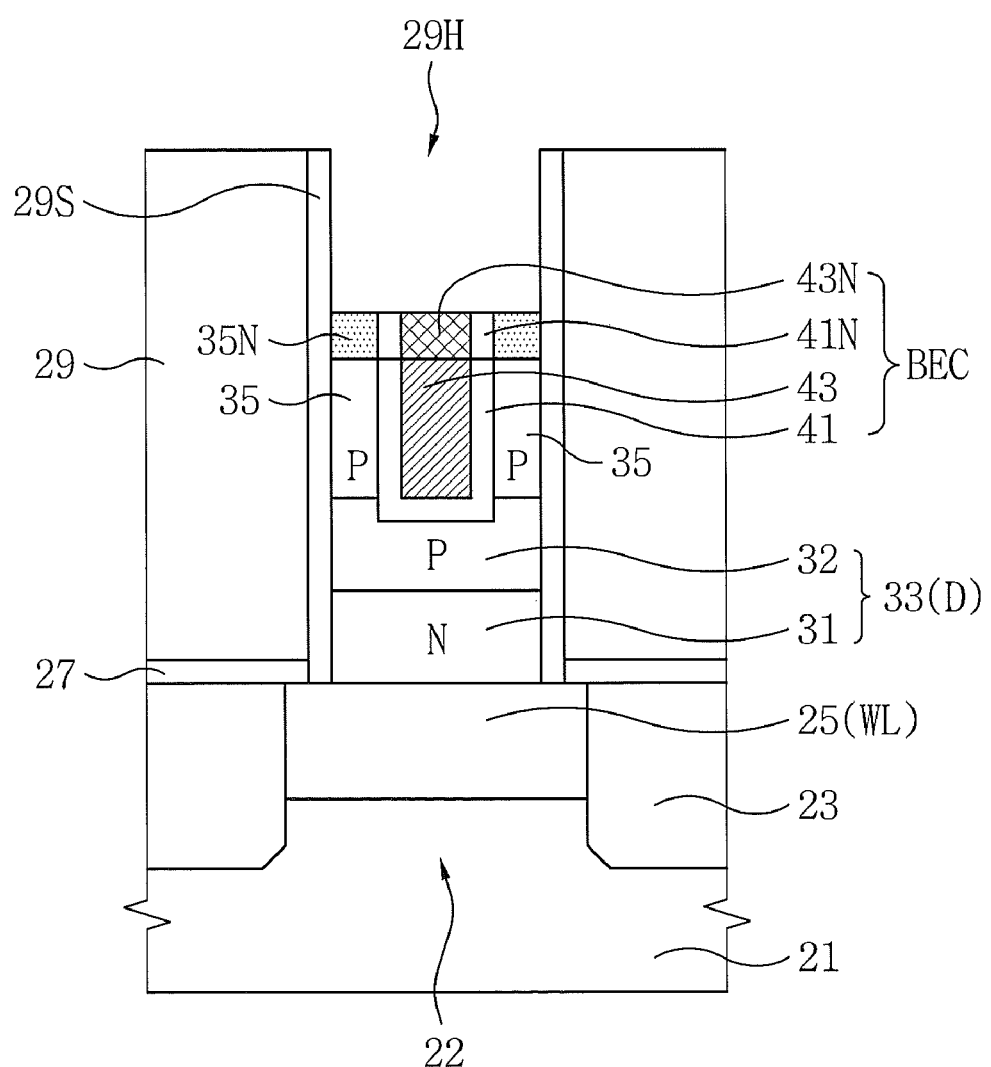

Referring to FIG. 24, a nitride spacer 35N may be formed on the top surface of the conductive spacer 35. The nitride spacer 35N may be formed by a rapid thermal nitridation (RTN) process or a plasma-enhanced nitridation process. During the formation of the nitride spacer 35N, a metal silicide nitride layer 41N may be formed on the top surface of the metal silicide layer 41, and an upper part 43N may be formed on the top surface of the bottom electrode layer 43L. As a result, the upper and lower parts 43N and 43 may constitute a bottom electrode 43 and 43N. The upper part 43N may be an N-rich bottom electrode.

Figure 25:
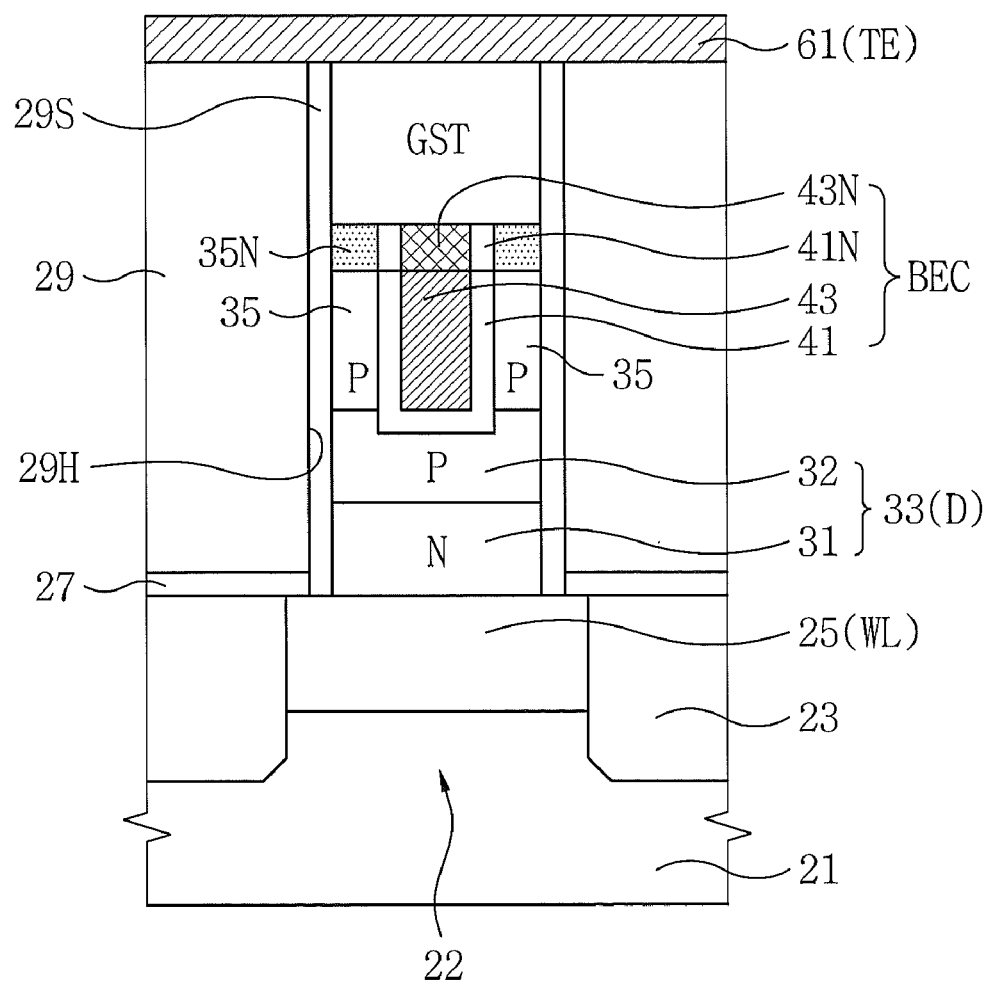

Referring to FIGS. 2 and 25, a resistance changeable element 55 may be formed on the upper part 43N, the metal silicide nitride layer 41N, and the nitride spacer 35N. The resistance changeable element 55 may fill the contact hole 29H. A TE 61 may be formed on the resistance changeable element 55. A BL 63 may be connected to the TE 61 and formed on the lower insulating layer 29.

Embodiment 5

FIGS. 26 through 31 are cross-sectional views illustrating a method of fabricating a non-volatile memory device according to fifth embodiments of the inventive concept.

Figure 26:
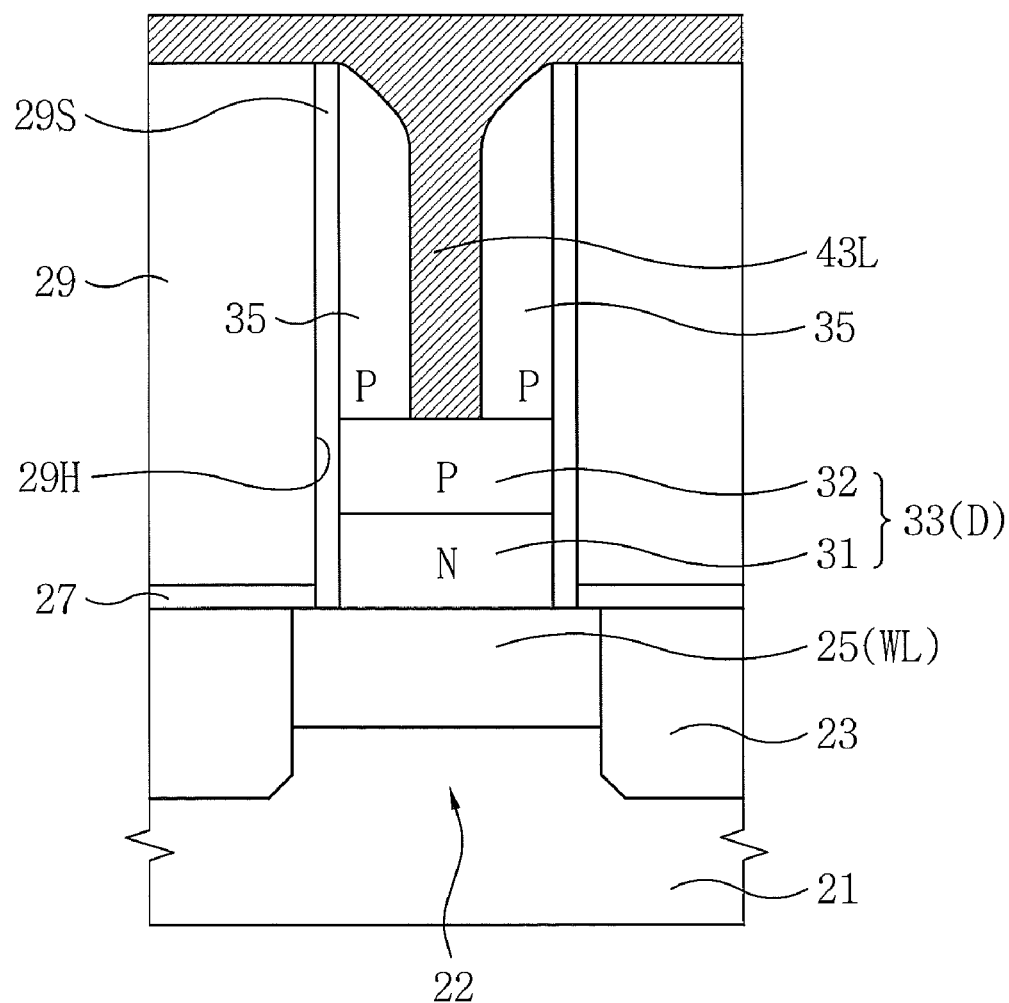
FIGS. 26 through 31 are cross-sectional views illustrating a method of fabricating a non-volatile memory device according to fifth embodiments of the inventive concept.
Figure 27:
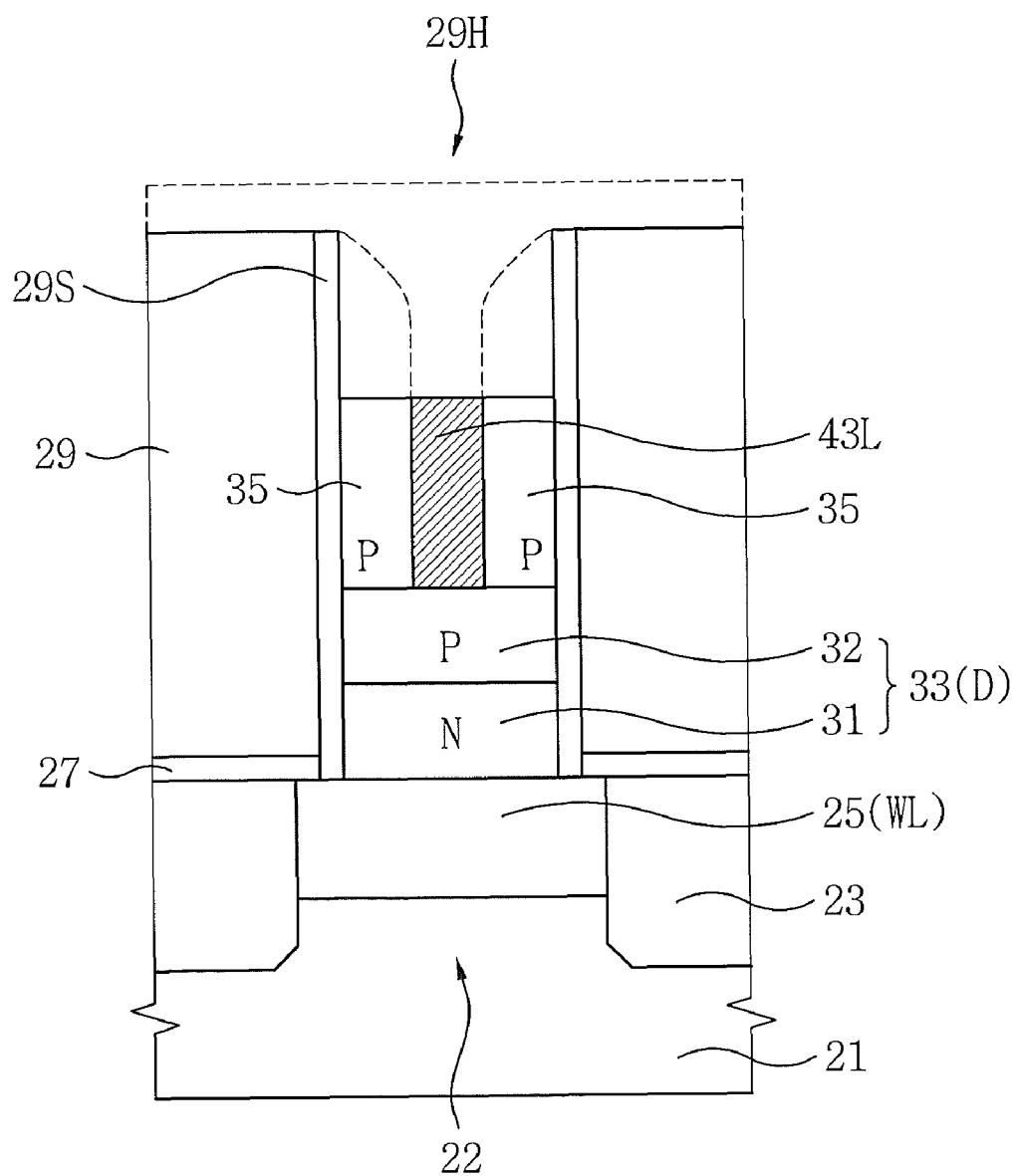

Referring to FIGS. 26 and 27, a bottom electrode layer 43L may be formed within a contact hole 29H. The bottom electrode layer 43L may completely fill the contact hole 29H. The bottom electrode layer 43L and the conductive spacer 35 may be partially removed. As a result, the bottom electrode layer 43L and the conductive spacer 35 may be confined within the contact hole 29H at an intermediate level of the contact hole 29H.

Figure 28:
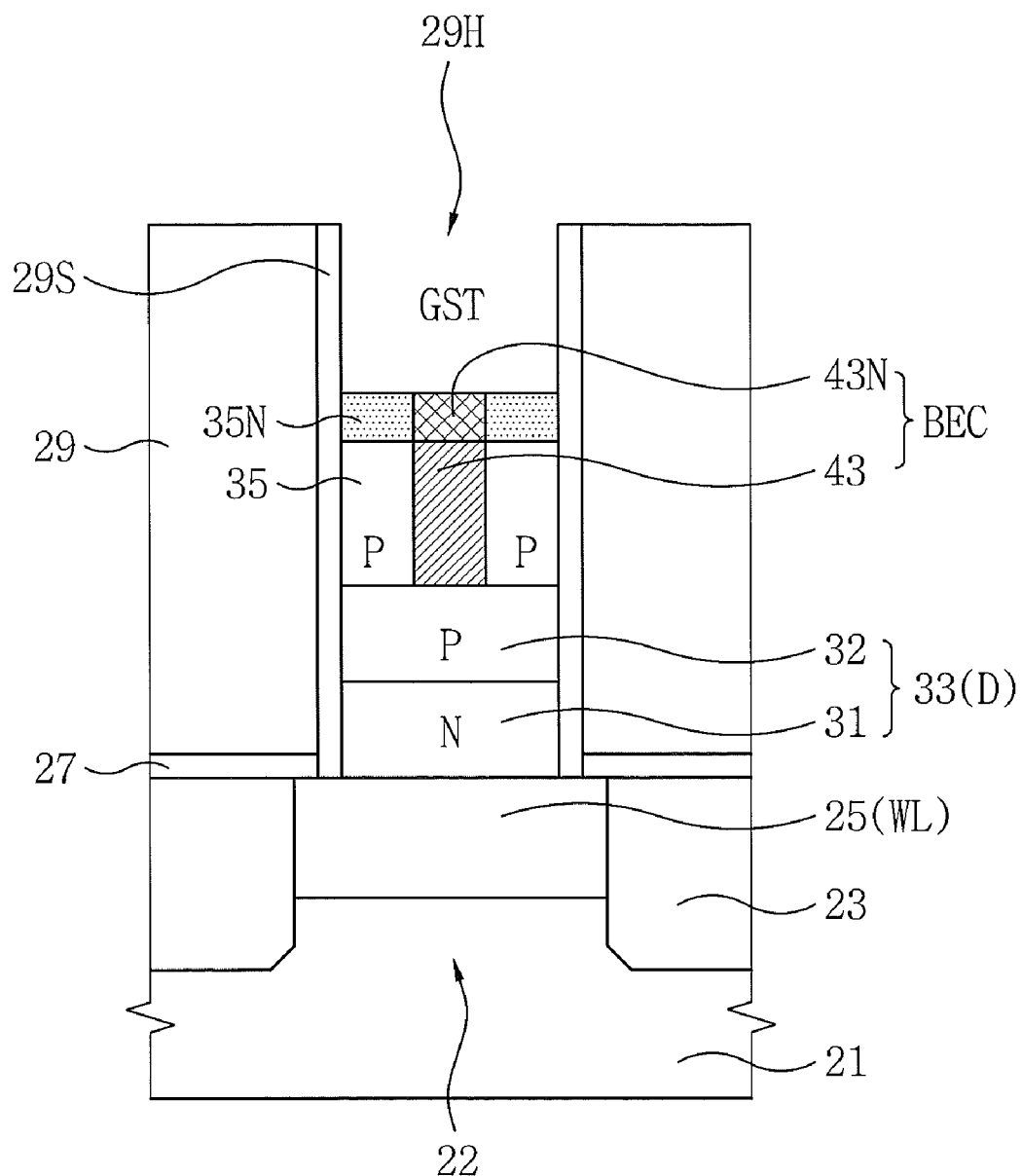

Referring to FIG. 28, a nitride spacer 35N may be formed on a top surface of the conductive spacer 35. The nitride spacer 35N may be formed by an RTN process or a plasma enhanced nitridation process. During the formation of the nitride spacer 35N, an upper part 43N may be formed on a top surface of the bottom electrode layer 43L. As a result, the upper and lower parts 43N and 43 may constitute a bottom electrode 43 and 43N. The upper part 43N may be an N-rich bottom electrode.

Figure 29:
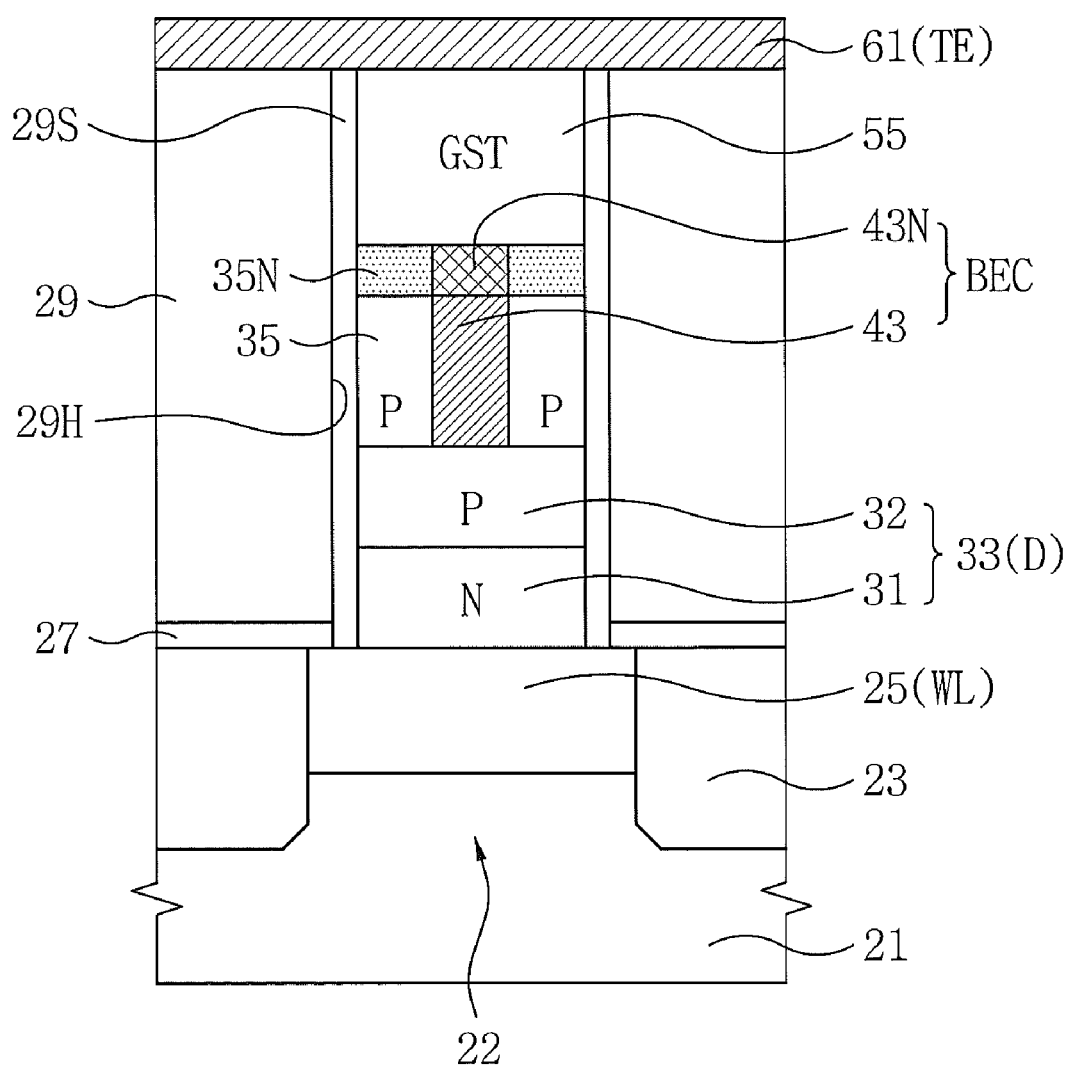

Referring to FIGS. 4 and 29, a resistance changeable element 55 may be formed on the upper part 43N, the metal silicide nitride layer 41N, and the nitride spacer 35N. The resistance changeable element 55 may fill the contact hole 29H. A TE 61 may be formed on the resistance changeable element 55. A BL 63 may be connected to the TE 61 and formed on the lower insulating layer 29.

Figure 30:
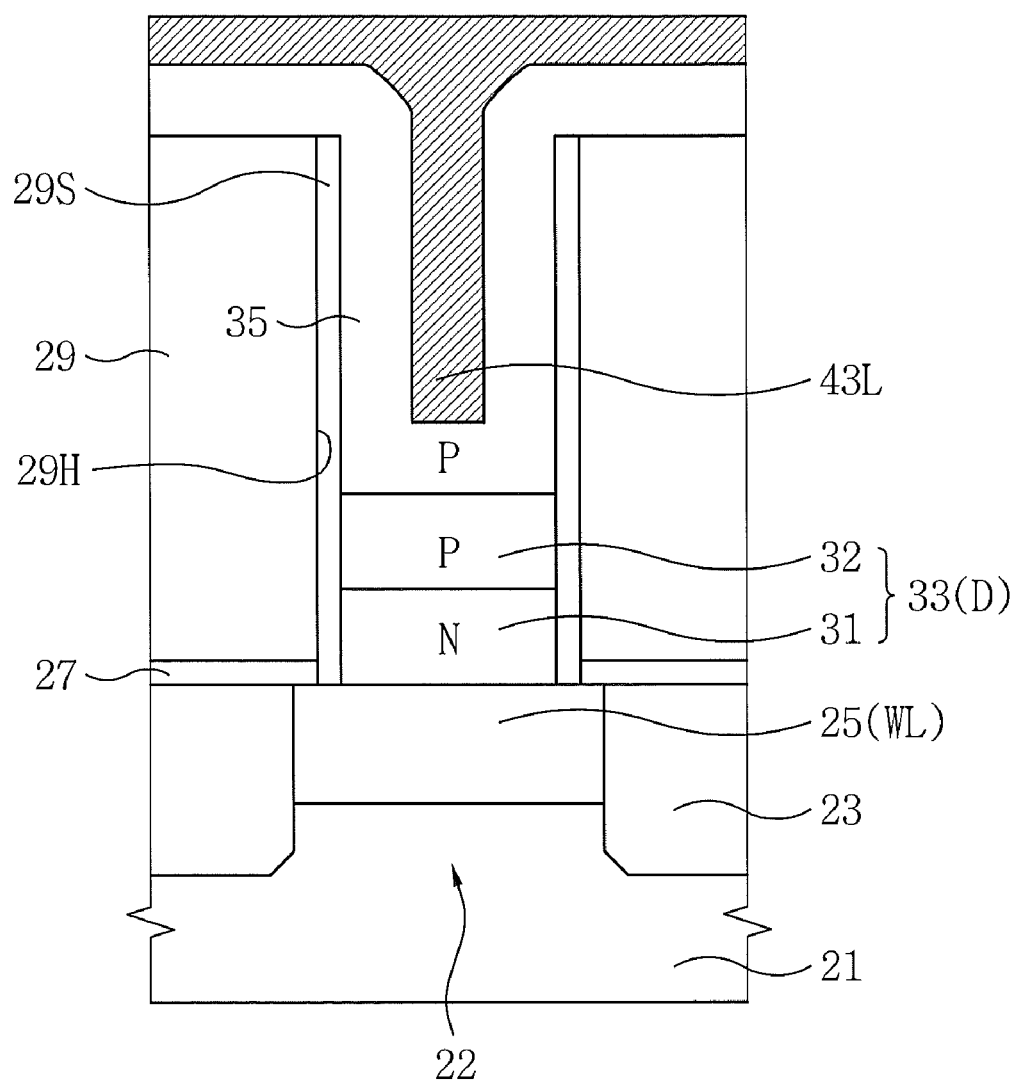

Referring to FIG. 30, a conductive spacer 35 and a bottom electrode layer 43L may be sequentially stacked on the diode 33. The conductive spacer 35 may cover a sidewall and bottom of the contact hole 29H. That is, the conductive spacer 35 may cover the diode 33. The bottom electrode layer 43L may completely fill the contact hole 29H.

Figure 31:
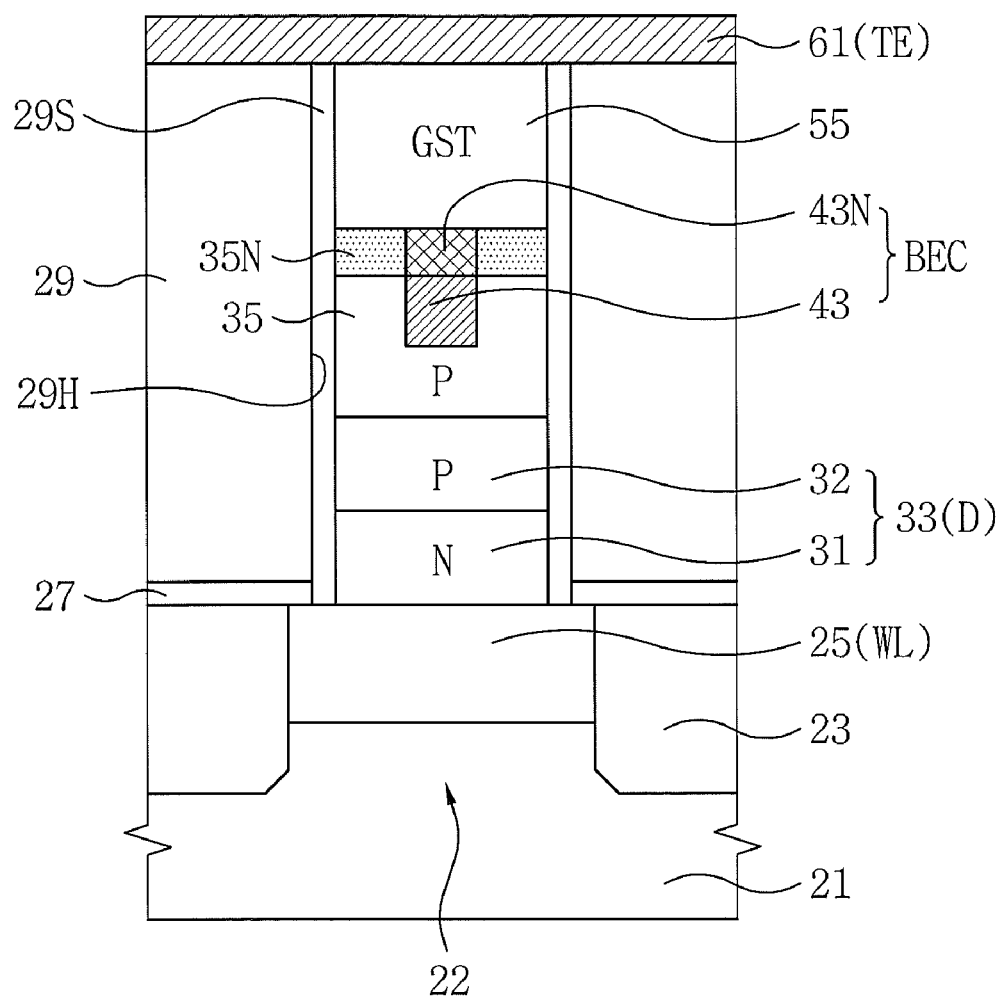

Referring to FIGS. 6 and 31, the bottom electrode layer 43L and the conductive spacer 35 may be partially removed. A nitride spacer 35N may be formed on a top surface of the conductive spacer 35. During the formation of the nitride spacer 35N, an upper part 43N may be formed on a top surface of the bottom electrode layer 43L. As a result, the upper and lower parts 43N and 43 may constitute a bottom electrode 43 and 43N. The upper part 43N may be an N-rich bottom electrode.

A resistance changeable element 55 may be formed on the upper part 43N and the nitride spacer 35N. A TE 61 may be formed on the resistance changeable element 55. A BL 63 may be connected to the TE 61 and formed on the lower insulating layer 29.

Embodiment 6

Figure 32:
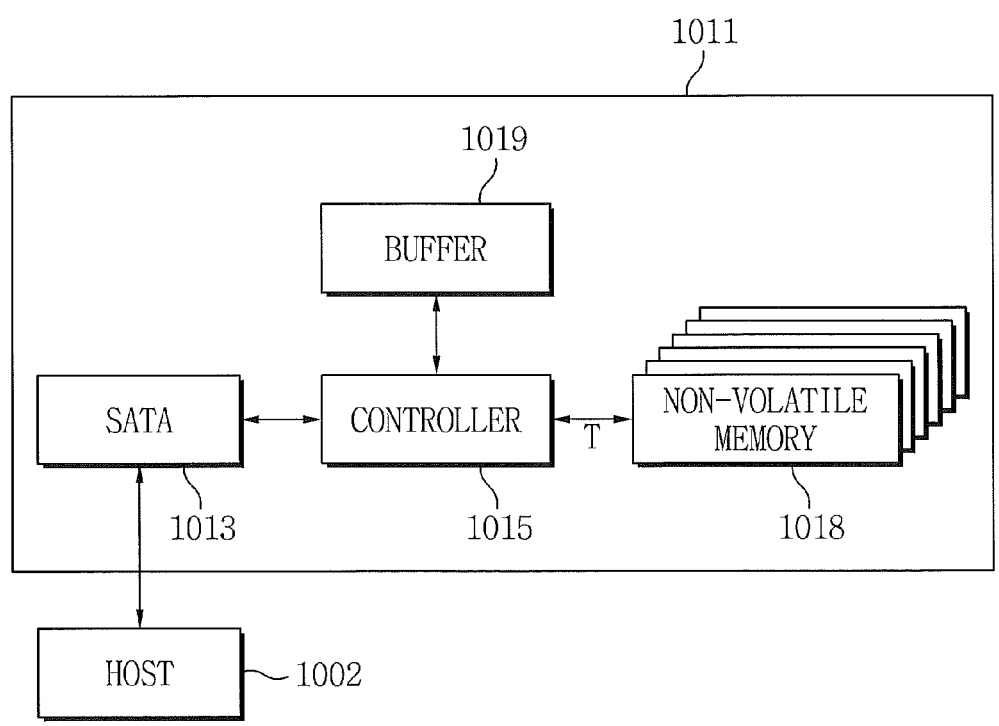
FIG. 32 is a system block diagram of an electronic apparatus according to a sixth embodiment of the inventive concept.

FIG. 32 is a system block diagram of an electronic apparatus according to a sixth embodiment of the inventive concept. The electronic apparatus may be a data storage apparatus, such as a solid-state disk (SSD) 1011.

Referring to FIG. 32, the solid-state disk (SSD) 1011 may include an interface 1013, a controller 1015, a non-volatile memory 1018, and a buffer memory 1019. The non-volatile memory 1018 may include a semiconductor device similar to one of the devices described with reference to FIGS. 1 through 31. For example, the non-volatile memory 1018 may include memory cells having a similar construction to the device of FIG. 2.

The SSD 1011 may be an apparatus configured to store information using a semiconductor device. As compared with a hard disk drive (HDD), the SSD 1011 may operate at a high speed, reduce mechanical delay, failure, rate, generation of heat, and noise, and be made compact and lightweight. The SSD 1011 may be used in laptop personal computers (laptop PCs), desktop PCs, MP3 players, or portable storage devices.

The controller 1015 may be formed adjacent to and electrically connected to the interface 1013. The controller 1015 may be a microprocessor (MP) including a memory controller and a buffer controller. The non-volatile memory 1018 may be formed adjacent to and electrically connected to the controller 1015. The SSD 1011 may have a data storage capacity corresponding to that of the non-volatile memory 1018. The buffer memory 1019 may be formed adjacent to and electrically connected to the controller 1015.

The interface 1013 may be connected to a host 1002 and serve to receive and transmit electric signals, such as data. For example, the interface 1013 may be an apparatus using a standard, such as serial advanced technology attachment (SATA), integrated drive electronics (IDE), small computer system interface (SCSI), and/or a combination thereof. The non-volatile memory 1018 may be connected to the interface 1013 through the controller 1015. The non-volatile memory 1018 may function to store received data through the interface 1013. Even if the supply of power to the SSD 1011 is interrupted, the non-volatile memory 1018 may be characterized by retaining the stored data.

The buffer memory 1019 may include a volatile memory. The volatile memory may be a dynamic random access memory (DRAM) and/or a static random access memory (SRAM). The buffer memory 1019 may exhibit a higher operating speed than the non-volatile memory 1018.

The data processing speed of the interface 1013 may be higher than the operating speed of the non-volatile memory 1018. Here, the buffer memory 1019 may serve to temporarily store data. After data received through the interface 1013 is temporarily stored in the buffer memory 1019 through the controller 1015, the received data may be permanently stored in the non-volatile memory 1018 at a data write speed of the non-volatile memory 1018. Also, among the data stored in the non-volatile memory 1018, frequently used data may be previously read and temporarily stored in the buffer memory 1019. That is, the buffer memory 1019 may function to increase effective the operating speed of the SSD 1011 and a decrease error rate.

Embodiment 7

Figure 33:
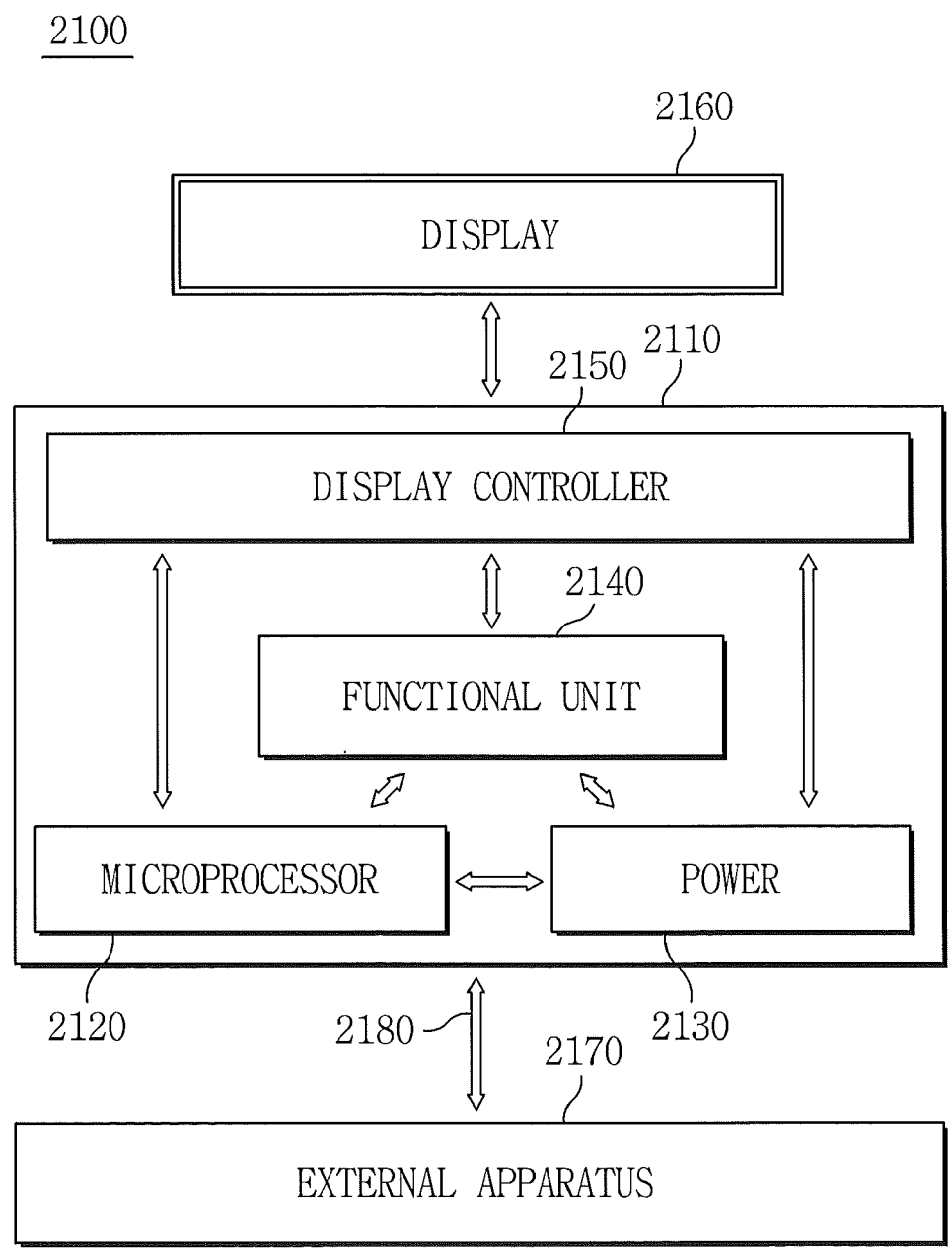
FIG. 33 is a system block diagram of an electronic apparatus according to a seventh embodiment of the inventive concept.

FIG. 33 is a system block diagram of an electronic apparatus according to a seventh embodiment of the inventive concept.

Referring to FIG. 33, a semiconductor device similar to one of the devices described with reference to FIGS. 1 through 31 may be applied to an electronic system 2100. The electronic system 2100 may include a body 2110, a microprocessor (MP) unit 2120, a power unit 2130, a functional unit 2140, and a display controller unit 2150. The body 2110 may be a mother board including a printed circuit board (PCB). The MP unit 2120, the power unit 2130, the functional unit 2140, and the display controller unit 2150 may be mounted on the body 2110. A display unit 2160 may be disposed inside or outside the body 2110. For instance, the display unit 2160 may be disposed on the surface of the body 2110 and display an image processed by the display controller unit 2150.

The power unit 2130 may receive a predetermined voltage from an external battery (not shown), divide the received voltage into required voltage levels, and supply the divided voltages to the MP unit 2120, the functional unit 2140, and the display controller unit 2150. The MP unit 2120 may receive a voltage from the power unit 2130 and control the functional unit 2140 and the display unit 2160. The functional unit 2140 may serve various functions of the electronic system 2100. For example, when the electronic system 2100 is a portable phone, the functional unit 2140 may include several components capable of serving various functions of the portable phone, for example, outputting an image to the display unit 2160 or outputting a voice to a speaker, by dialing or communicating with an external apparatus 2170. When a camera is also mounted, the functional unit 2140 may serve as a camera image processor.

According to some embodiments, when the electronic system 2100 is connected to a memory card for capacity expansion, the functional unit 2140 may be a memory card controller. The functional unit 2140 may receive and transmit signals from and to the external apparatus 2140 through a wired or wireless communication unit 2180. Furthermore, when the electronic system 2100 needs a universal serial bus (USB) for functional expansion, the functional unit 2140 may serve as an interface controller.

A semiconductor device similar to one of the semiconductor devices described with reference to FIGS. 1 through 31 may be applied to at least one of the MP unit 2120 and the functional unit 2140. For example, the functional unit 2140 may include memory cells having a similar construction to the device of FIG. 2. In this case, the BL (refer to 63 in FIG. 2) and the WL (refer to 25 in FIG. 2) may be electrically connected to the MP unit 2120 through the body 2110.

According to the inventive concept, a conductive spacer and a nitride spacer covering a sidewall of a bottom electrode can be provided. The conductive spacer can expand an electrical connection path between a diode and the bottom electrode. The nitride spacer can electrically insulate a resistance changeable element and the conductive spacer from each other. As a result, the contact area between the bottom electrode and the resistance changeable element can be minimized, and the current drivability of the bottom electrode can be maximized.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A non-volatile memory device comprising:
   a bottom electrode disposed on a substrate and having a lower part and an upper part;
   a conductive spacer disposed on a sidewall of the lower part of the bottom electrode;
   a nitride spacer disposed on a top surface of the conductive spacer and a sidewall of the upper part of the bottom electrode; and
   a resistance changeable element disposed on the upper part of the bottom electrode and the nitride spacer,
   wherein the upper part of the bottom electrode contains nitrogen (N).

2. The device of claim 1, wherein:
   the conductive spacer is directly on the sidewall of the lower part of the bottom electrode; and the nitride spacer is directly on the sidewall of the upper part of the bottom electrode.

3. The device of claim 1, wherein the nitride spacer comprises a material obtained by nitrifying the conductive spacer and is self-aligned with the conductive spacer.

4. The device of claim 3, wherein the conductive spacer comprises silicon (Si), and the nitride spacer comprises silicon nitride.

5. The device of claim 1, wherein a top surface of the upper part of the bottom electrode is lower than a top surface of the nitride spacer relative to the substrate.

6. The device of claim 5, wherein the resistance changeable element directly contacts the top surface of the upper part of the bottom electrode and a lateral surface of the nitride spacer.

7. The device of claim 1, wherein a top surface of the nitride spacer is lower than a top surface of the upper part of the bottom electrode relative to the substrate.

8. The device of claim 1, further comprising:
a metal silicide layer interposed between the lower part of the bottom electrode and the conductive spacer; and
a metal silicide nitride layer disposed on the metal silicide layer and interposed between the nitride spacer and the upper part of the bottom electrode.

9. The device of claim 1, further comprising a core layer disposed under the resistance changeable element,
wherein the bottom electrode covers a sidewall and bottom surface of the core layer.

10. The device of claim 9, further comprising a core nitride layer disposed on and self-aligned with the core layer,
wherein the core nitride layer covers the sidewall of the upper part of the bottom electrode.

11. The device of claim 1, further comprising a lower insulating layer having a contact hole extending to the substrate,
wherein the bottom electrode, the conductive spacer, and the nitride spacer are confined within the contact hole.

12. The device of claim 1, further comprising a diode disposed on the substrate,
wherein the bottom electrode and the conductive spacer are disposed on the diode.

13. The device of claim 12, wherein the diode comprises:
a first diode pattern; and
a second diode pattern disposed on the first diode pattern,
wherein the conductive spacer directly contacts the second diode pattern, and the second diode pattern and the conductive spacer comprise semiconductor layers of the same conductivity type.

14. The device of claim 13, wherein each of the second diode pattern and the conductive spacer comprises a P-type silicon layer.

15. The device of claim 13, wherein the conductive spacer extends between the bottom electrode and the second diode pattern.

16. The device of claim 1, wherein the upper and lower parts of the bottom electrode comprise the same material.

17. The device of claim 1, wherein the lower part of the bottom electrode contains a smaller amount of nitrogen than the upper part of the bottom electrode.

18. A non-volatile memory device comprising:
a first diode pattern on a substrate;
a second diode pattern on the first diode pattern;
a bottom electrode on the second diode pattern;
a conductive spacer on the second diode pattern and configured to cover a first portion of a sidewall of the bottom electrode;
a nitride spacer on the conductive spacer and adjacent to a second portion of the sidewall of the bottom electrode;
a metal silicide layer interposed between the conductive spacer and the first portion of the sidewall of the bottom electrode;
a metal silicide nitride layer on the metal silicide layer and interposed between the nitride spacer and the second portion of the sidewall of the bottom electrode; and
a resistance changeable element on the bottom electrode, the metal silicide nitride layer, and the nitride spacer,
wherein the metal silicide layer contacts the second diode pattern.

19. A non-volatile memory device comprising:
a substrate;
a diode pattern on the substrate;
a bottom electrode on the diode pattern that extends upward away from the substrate, wherein an upper portion of the bottom electrode contains more nitrogen than a lower portion of the bottom electrode;
a conductive spacer that extends from the diode pattern upward covering a sidewall of the bottom electrode, wherein an upper portion of the conductive spacer is a nitride spacer containing more nitrogen than a lower portion of the conductive spacer; and
a resistance changeable element on the bottom electrode and the nitride spacer.

20. The non-volatile memory device of claim 19, further comprising:
a metal silicide layer that extends from the diode pattern upward between the conductive spacer and the sidewall of the bottom electrode, wherein an upper portion of the metal silicide layer is a metal silicide nitride layer containing more nitrogen than a lower portion of the metal silicide layer.

* * * * *